United States Patent
Afzali-Ardakani et al.

(10) Patent No.: US 11,903,328 B2
(45) Date of Patent: Feb. 13, 2024

(54) SELF ASSEMBLED MONOLAYER FORMED ON A QUANTUM DEVICE

(71) Applicant: International Business Machines Corporation, Armonk, NY (US)

(72) Inventors: Ali Afzali-Ardakani, Ossining, NY (US); Richard Alan Haight, Mahopac, NY (US); Martin O. Sandberg, Ossining, NY (US); Vivekananda P. Adiga, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 551 days.

(21) Appl. No.: 16/784,872

(22) Filed: Feb. 7, 2020

(65) Prior Publication Data
US 2021/0249582 A1    Aug. 12, 2021

(51) Int. Cl.
*H10N 60/01*    (2023.01)
*H10N 60/80*    (2023.01)
*H10N 60/12*    (2023.01)

(52) U.S. Cl.
CPC ..... *H10N 60/0156* (2023.02); *H10N 60/0912* (2023.02); *H10N 60/12* (2023.02); *H10N 60/805* (2023.02)

(58) Field of Classification Search
None
See application file for complete search history.

(56) References Cited

U.S. PATENT DOCUMENTS

| | | |
|---|---|---|
| 5,846,909 A | 12/1998 | McDevitt et al. |
| 6,506,814 B2 | 1/2003 | Krongauz et al. |
| 8,189,980 B2 | 5/2012 | Miyazaki et al. |
| 9,281,463 B2 | 3/2016 | Greer et al. |
| 9,455,073 B2 | 9/2016 | Barabash et al. |
| 9,593,414 B2 | 3/2017 | Barabash et al. |
| 9,741,920 B1 | 8/2017 | Tolpygo et al. |
| 9,824,796 B2 | 11/2017 | Machi et al. |
| 10,208,148 B2 | 2/2019 | Corten et al. |
| 10,318,880 B2 | 6/2019 | Pereverzev |
| 10,367,133 B1 | 7/2019 | Tahan |
| 10,867,850 B2 * | 12/2020 | Lee ................... H01L 21/76897 |
| 10,978,350 B2 * | 4/2021 | Chen ................ H01L 29/66545 |

(Continued)

FOREIGN PATENT DOCUMENTS

| | | |
|---|---|---|
| CN | 102 530 856 B | 12/2016 |
| GB | 2372717 | 4/2001 |

(Continued)

OTHER PUBLICATIONS

Bass et al., "Microcontact printing with octadecanethiol", Applied Surface Science 226 (2004). pp. 335-340. (Year: 2004).*
Magnussen et al., "Self-assembly of organic films on a liquid metal", Nature, vol. 384 (1996). pp. 250-252. (Year: 1996).*

(Continued)

*Primary Examiner* — Scott B Geyer
(74) *Attorney, Agent, or Firm* — Amin, Turocy & Watson, LLP

(57) ABSTRACT

Devices, methods, and/or computer-implemented methods that can facilitate formation of a self assembled monolayer on a quantum device are provided. According to an embodiment, a device can comprise a qubit formed on a substrate. The device can further comprise a self assembled monolayer formed on the qubit.

10 Claims, 14 Drawing Sheets
(5 of 14 Drawing Sheet(s) Filed in Color)

(56) References Cited

U.S. PATENT DOCUMENTS

| | | | |
|---|---|---|---|
| 2006/0246217 A1* | 11/2006 | Weidman | H01L 21/76889 427/443.1 |
| 2007/0048746 A1 | 3/2007 | Su et al. | |
| 2007/0272003 A1* | 11/2007 | Frederix | B05D 1/185 562/602 |
| 2009/0184002 A1* | 7/2009 | Furukawa | G01N 33/5438 204/406 |
| 2015/0091142 A1* | 4/2015 | Adelmann | H01L 21/02107 257/632 |
| 2016/0104073 A1 | 4/2016 | Sandberg et al. | |
| 2017/0148640 A1* | 5/2017 | Wang | H01L 21/3105 |
| 2020/0035501 A1* | 1/2020 | Tabata | H01L 21/3083 |
| 2020/0048762 A1* | 2/2020 | Ke | H01L 21/76883 |
| 2021/0189146 A1* | 6/2021 | Noh | C23C 16/45553 |

FOREIGN PATENT DOCUMENTS

| | | | |
|---|---|---|---|
| WO | WO-2004109750 A2 * | 12/2004 | B82Y 10/00 |
| WO | 2018236374 A1 | 12/2018 | |

OTHER PUBLICATIONS

Heimel et al., "The Interface Energetics of Self-Assembled Monolayers on Metals", Accounts of Chemical Research vol. 41, No. 6 (2008). pp. 721-729. (Year: 2008).*

Heimel et al., "Organic/metal interfaces in self-assembled monolayers of conjugated thiols: A first-principles benchmark study", Surface Science 600 (2006). pp. 4548-4562. (Year: 2006).*

International Search Report and Written Opinion for International Application No. PCT/EP2021/052571 dated Apr. 29, 2021, 11 pages.

Oda Shun Ri et al: "Low-Dimensional-Structure Devices for Future Electronics Behaviors", 2018 International Semiconductor Conference (CAS). IEEE, Oct. 10, 2018 (Oct. 10, 2018), pp. 3-6, XP033449316, DOI: 10.1109/SMICND.2018.8539751 [retrieved on Nov. 16, 2018] paragraph [0004]; figure 3.

Examination Report No. 1 received for Australian Patent Application Serial No. 2021215331 dated May 25, 2023, 4 pages.

Response to the Communication pursuant to R 161(1) and R 162 EPC filed Mar. 23, 2023 for EP Application Serial No. 21703428.9, 4 pages.

* cited by examiner

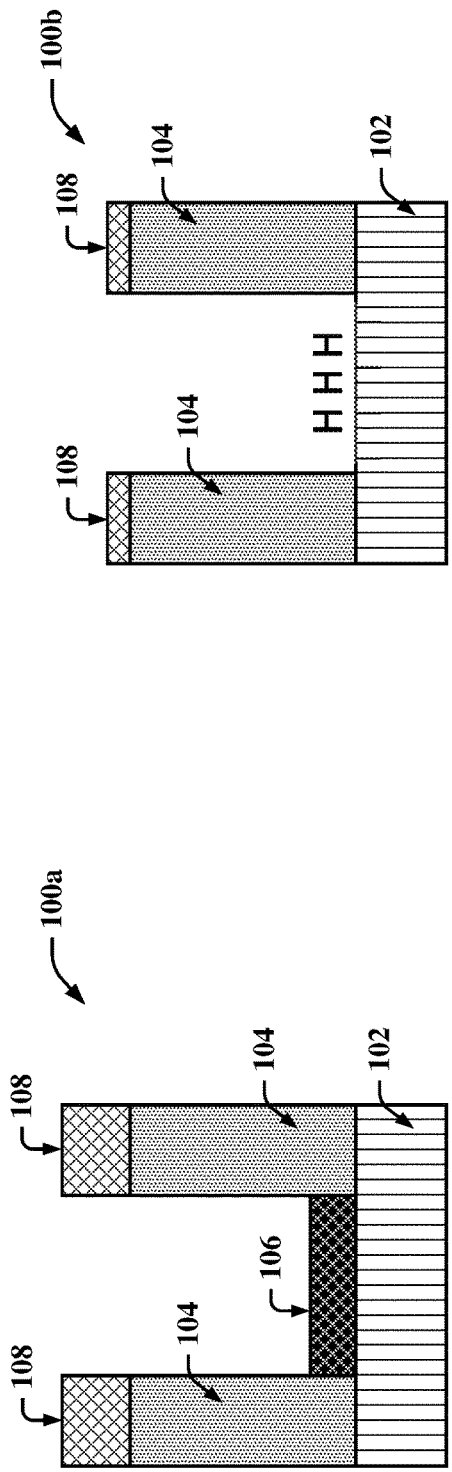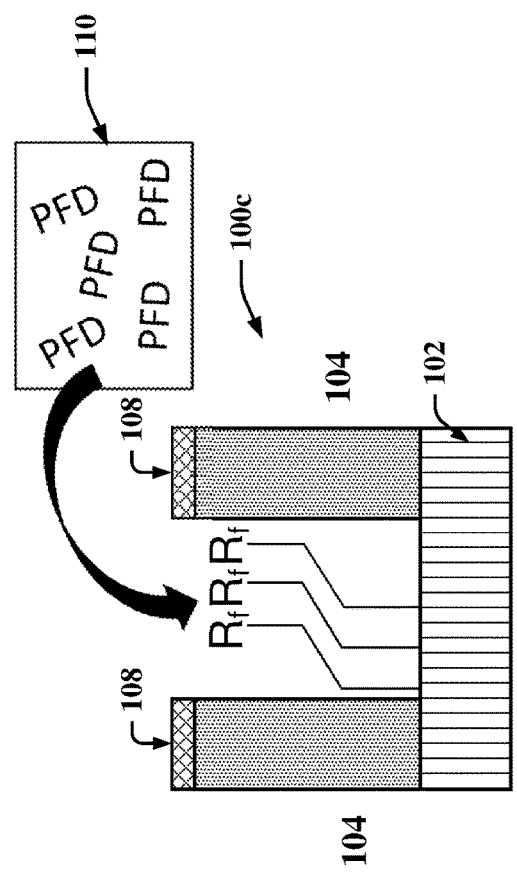
FIG. 1A
FIG. 1B
FIG. 1C

Ultraviolet photoelectron spectroscopy of H-terminated Si surface following TFA or HF treatment to remove $SiO_2$ Ultraviolet photoelectron spectroscopy of of Si coated with self-assembled monolayer Perfluorodecene (PFD) showing the molecular structure of adsorbed monolayer X-ray photoelectron spectrum of perfluorodecene coated Si surface. The F1s core level is further indication of PFD SAM

SELF ASSEMBLED MONOLAYER FORMED ON A QUANTUM DEVICE

BACKGROUND

The subject disclosure relates to a self assembled monolayer formed on an integrated circuit and a method to form the same. More specifically, the subject disclosure relates to a self assembled monolayer formed on a quantum device and a method to form the same.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, devices and/or methods (e.g., computer-implemented methods) that facilitate formation of a self assembled monolayer on a quantum device are described.

According to an embodiment, a device can comprise a qubit formed on a substrate. The device can further comprise a self assembled monolayer formed on the qubit. An advantage of such a device is that it can facilitate at least one of improved coherence time and/or improved lifespan of the qubit.

In some embodiments, the self assembled monolayer is formed on at least one of the qubit or the substrate to prevent oxidation of at least one of the qubit or the substrate. An advantage of such a device is that it can facilitate at least one of improved coherence time and/or improved lifespan of the qubit.

According to an embodiment, a method can comprise removing one or more oxide layers from a qubit formed on a substrate. The method can further comprise depositing a self assembled monolayer on the qubit. An advantage of such a method is that it can be implemented to facilitate at least one of improved coherence time and/or improved lifespan of the qubit.

In some embodiments, the method above can further comprise removing at least one oxide layer from at least one of the qubit or the substrate and depositing the self assembled monolayer on at least one of the qubit or the substrate to prevent oxidation of at least one of the qubit or the substrate. An advantage of such a method is that it can be implemented to facilitate at least one of improved coherence time and/or improved lifespan of the qubit.

According to an embodiment, a device can comprise one or more superconducting components formed on a substrate. The device can further comprise a self assembled monolayer formed on the one or more superconducting components. An advantage of such a device is that it can facilitate at least one of improved coherence time and/or improved lifespan of the one or more superconducting components.

In some embodiments, the self assembled monolayer is formed on at least one of the one or more superconducting components or the substrate to prevent oxidation of at least one of the one or more superconducting components or the substrate. An advantage of such a device is that it can facilitate at least one of improved coherence time and/or improved lifespan of the one or more superconducting components.

According to an embodiment, a method can comprise removing one or more oxide layers from one or more superconducting components formed on a substrate. The method can further comprise depositing a self assembled monolayer on the one or more superconducting components. An advantage of such a method is that it can be implemented to facilitate at least one of improved coherence time and/or improved lifespan of the one or more superconducting components.

In some embodiments, the method above can further comprise removing at least one oxide layer from at least one of the one or more superconducting components or the substrate and depositing the self assembled monolayer on at least one of the one or more superconducting components or the substrate using at least one of a solution based self assembled monolayer deposition process or a vapor phase based self assembled monolayer deposition process. An advantage of such a method is that it can be implemented to facilitate at least one of improved coherence time and/or improved lifespan of the superconducting components.

According to an embodiment, a device can comprise a qubit formed on a substrate of a bump bonded device. The device can further comprise a self assembled monolayer formed on the qubit. An advantage of such a device is that it can facilitate at least one of improved coherence time and/or improved lifespan of the qubit.

In some embodiments, the self assembled monolayer is formed on at least one of the qubit or the substrate to prevent oxidation of at least one of the qubit or the substrate. An advantage of such a device is that it can facilitate at least one of improved coherence time and/or improved lifespan of the qubit.

DESCRIPTION OF THE DRAWINGS

The patent or application file contains at least one drawing executed in color. Copies of this patent or patent application publication with color drawing(s) will be provided by the Office upon request and payment of the necessary fee.

FIG. 1A illustrates a cross-sectional side view of an example, non-limiting device that can comprise one or more oxide layers on a substrate and/or on one or more superconducting components formed on the substrate in accordance with one or more embodiments described herein.

FIG. 1B illustrates a cross-sectional side view of the example, non-limiting device of FIG. 1A after removal of the one or more oxide layers from one or more surfaces in accordance with one or more embodiments described herein.

FIG. 1C illustrates a cross-sectional side view of the example, non-limiting device of FIG. 1B after formation of one or more self assembled monolayers on the one or more surfaces of the substrate and/or the one or more superconducting components.

DETAILED DESCRIPTION

Figure 2:
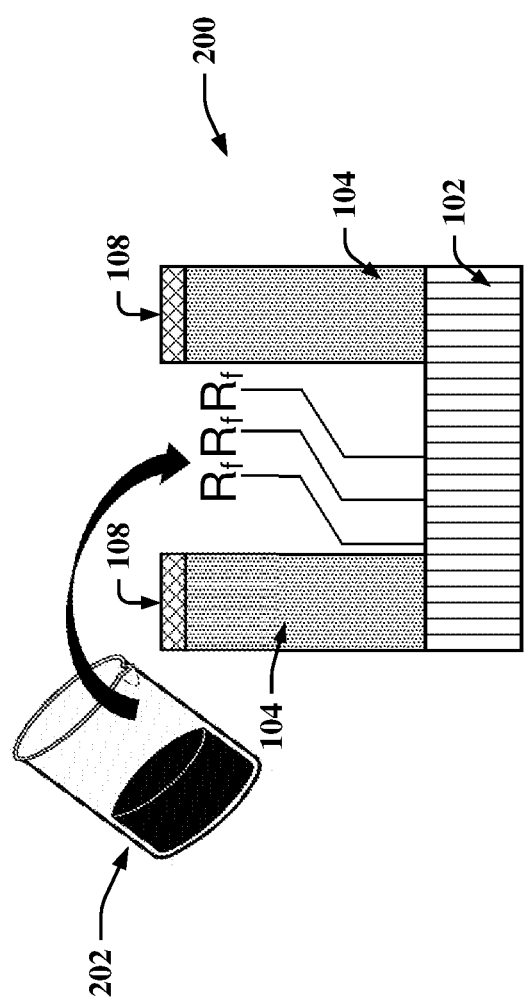
FIG. 2 illustrates a cross-sectional side view of the example, non-limiting device of FIG. 1B after formation of one or more self assembled monolayers on the one or more surfaces of the substrate and/or the one or more superconducting components.

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details. It is noted that the drawings of the present application are provided for illustrative purposes only and, as such, the drawings are not drawn to scale.

Quantum processors based around superconducting quantum bits (qubits) can consist of Josephson Junctions of aluminum (Al), aluminum oxide ($Al_2O_3$), and aluminum (Al) stacks (Al/$Al_2O_3$/Al stacks). In some implementations they are connected to one or more superconducting components such as, for instance, niobium (Nb) resonators deposited on a highly resistive substrate such as, for instance, silicon (Si). Through appropriate device architecture and design, the lifetime of the wavefunction within the qubit has over recent years improved to several hundred microseconds, but additional increases in the lifetime of the wavefunction have not been realized. The wavefunction itself oscillates at a radio frequency (RF) of approximately 5 gigahertz (~5 GHz). At this frequency, absorption of RF photons within the oxides that form on the substrate and/or the one or more superconducting components, both during device fabrication and during extended presence in the atmosphere, can significantly impact the lifetime of the quantum bit.

It is experimentally known that both silicon dioxide ($SiO_2$) that forms on the surface of a silicon (Si) substrate, as well as niobium monoxide (NbO), niobium dioxide ($NbO_2$), and/or niobium pentoxide ($Nb_2O_5$) that form on niobium (Nb) resonator lines absorb strongly in the RF regime. While oxides on a silicon (Si) substrate (e.g., silicon dioxide ($SiO_2$)) can be removed via treatment with a dilute hydrogen fluoride (HF) etchant (dilute HF etchant) that both removes the oxide and H-terminates the surface, niobium oxides such as niobium pentoxide ($Nb_2O_5$), niobium dioxide ($NbO_2$), and/or niobium monoxide (NbO) can also be removed with this etch but regrow rapidly in ambient atmosphere.

A problem with existing quantum devices (e.g., quantum processor, quantum chip, superconducting circuit integrated on a substrate, quantum bump bonded device, etc.) and/or manufacturing processes that facilitate fabrication of such quantum devices is that they do not provide for removal of such oxides from quantum device, nor do they prevent such oxides from reforming (e.g., via exposure to air during fabrication) on the quantum device. Given the problems described above with existing technologies (e.g., quantum devices and/or manufacturing processes) failing to provide for removal of such oxides from surfaces of a quantum device and preventing reformation of such oxides on the quantum device, the present disclosure can be implemented to produce a solution to this problem in the form of devices and/or methods (e.g., computer-implemented methods) that can provide one or more self assembled monolayers formed on one or more superconducting components (e.g., qubit, resonator, capacitor, etc.) of a quantum device (e.g., a quantum chip, a bump bonded device comprising a qubit, a superconducting circuit comprising a qubit integrated on a substrate, etc.). An advantage of such devices and/or methods is that they can facilitate at least one of improved coherence time and/or improved lifespan of the one or more superconducting components (e.g., a qubit).

In some embodiments, the one or more self assembled monolayers can be formed on one or more superconducting components (e.g., qubit, resonator, capacitor, etc.) of a quantum device (e.g., a quantum chip, a bump bonded device comprising a qubit, a superconducting circuit comprising a qubit integrated on a substrate, etc.) and a substrate on which the one or more superconducting components are formed (e.g., integrated). An advantage of such devices and/or methods is that they can facilitate at least one of improved coherence time and/or improved lifespan of the one or more superconducting components (e.g., a qubit).

FIGS. 1A-5, 8, and/or 9 illustrate example, non-limiting multi-step fabrication sequences that can be implemented to fabricate one or more embodiments of the subject disclosure described herein and/or illustrated in the figures. For example, the non-limiting multi-step fabrication sequence illustrated in FIGS. 1A-1C can be implemented to fabricate device 100c, where device 100c can comprise a semiconducting and superconducting device comprising one or more components (e.g., silicon (Si) substrate, superconducting component(s), qubit, resonator, capacitor, etc.) having one or more self assembled monolayers formed thereon. In another example, the non-limiting multi-step fabrication sequence illustrated in FIGS. 1A, 1B, and 2 can be implemented to fabricate device 200, where device 200 can comprise an example, non-limiting alternative embodiment of device 100c. In another example, the non-limiting multi-step fabrication sequence illustrated in FIGS. 1A, 1B, 3A, and 3B can be implemented to fabricate device 300a and/or 300b, where device 300a can comprise an example, non-limiting alternative embodiment of device 100b and/or device 300b can comprise an example, non-limiting alternative embodiment of device 100c and/or device 200. For instance, the non-limiting multi-step fabrication sequence illustrated in FIGS. 1A, 1B, 3A, and 3B can be implemented to fabricate device 300a and/or device 300b, where such device(s) can comprise bump bonded device(s) comprising one or more semiconducting components (e.g., silicon (Si) substrate) and superconducting components (e.g., qubit, resonator, capacitor, etc.) having one or more self assembled monolayers formed thereon.

In an example, device 100c, 200, 300a, and/or 300b can be implemented in a quantum computing device (e.g., a quantum processor, a quantum computer, etc.), where such device(s) can comprise one or more superconducting components that can be implemented in such a quantum computing device. For instance, device 100c, 200, 300a, and/or 300b can be implemented in a quantum computing device (e.g., a quantum processor, a quantum computer, etc.), where such device(s) can comprise one or more qubits and/or resonators (e.g., bus resonator, transmission resonator, etc.) that can be implemented in such a quantum computing device.

As described below with reference to FIGS. 1A-5, 8, and/or 9, fabrication of the various embodiments of the subject disclosure described herein and/or illustrated in the figures (e.g., device 100c, 200, 300a, and/or 300b) can comprise multi-step sequences of, for example, photolithographic and/or chemical processing steps that facilitate gradual creation of electronic-based systems, devices, components, and/or circuits in a semiconducting and superconducting device (e.g., an integrated circuit). For instance, the various embodiments of the subject disclosure described herein and/or illustrated in the figures (e.g., device 100c, 200, 300a, and/or 300b) can be fabricated by employing techniques including, but not limited to: photolithography, microlithography, nanolithography, nanoimprint lithography, photomasking techniques, patterning techniques, photoresist techniques (e.g., positive-tone photoresist, negative-tone photoresist, hybrid-tone photoresist, etc.), etching techniques (e.g., reactive ion etching (RIE), dry etching, wet etching, ion beam etching, plasma etching, laser ablation, etc.), evaporation techniques, sputtering techniques, plasma ashing techniques, thermal treatments (e.g., rapid thermal anneal, furnace anneals, thermal oxidation, etc.), chemical vapor deposition (CVD), atomic layer deposition (ALD), physical vapor deposition (PVD), molecular beam epitaxy (MBE), electrochemical deposition (ECD), chemical-mechanical planarization (CMP), backgrinding techniques, and/or another technique for fabricating an integrated circuit.

As described below with reference to FIGS. 1A-5, 8, and/or 9, the various embodiments of the subject disclosure described herein and/or illustrated in the figures (e.g., device 100c, 200, 300a, and/or 300b) can be fabricated using various materials. For example, the various embodiments of the subject disclosure described herein and/or illustrated in the figures (e.g., device 100c, 200, 300a, and/or 300b) can be fabricated using materials of one or more different material classes including, but not limited to: conductive materials, semiconducting materials, superconducting materials, dielectric materials, polymer materials, organic materials, inorganic materials, non-conductive materials, and/or another material that can be utilized with one or more of the techniques described above for fabricating an integrated circuit.

It will be understood that when an element as a layer (also referred to as a film), region, and/or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present. It will also be understood that when an element is referred to as being "coupled" to another element, it can describe one or more different types of coupling including, but not limited to, chemical coupling, communicative coupling, electrical coupling, physical coupling, operative coupling, optical coupling, thermal coupling, and/or another type of coupling.

FIG. 1A illustrates a cross-sectional side view of an example, non-limiting device 100a that can comprise one or more oxide layers on a substrate and/or on one or more superconducting components formed on the substrate in accordance with one or more embodiments described herein. Such one or more superconducting components can be formed on a substrate of device 100a as described below.

Device 100a can comprise a substrate 102. Substrate 102 can comprise any material having semiconductor properties including, but not limited to, silicon (Si), sapphire (e.g., aluminum oxide ($Al_2O_3$)), silicon-germanium (SiGe), silicon-germanium-carbon (SiGeC), silicon carbide (SiC), germanium (Ge) alloys, III/V compound semiconductors, II/VI compound semiconductors, and/or another material. In some embodiments, substrate 102 can comprise a layered semiconductor including, but not limited to, silicon/silicon-germanium (Si/SiGe), silicon/silicon carbide (Si/SiC), silicon-on-insulators (SOIs), silicon germanium-on-insulators (SGOIs), and/or another layered semiconductor. In an example, substrate 102 can comprise a silicon (Si) substrate.

Device 100a can further comprise one or more superconducting components 104 that can be formed on substrate 102. Such superconducting component(s) 104 can be formed on substrate 102 using one or more photolithography, patterning, photoresist, and/or material deposition techniques defined above (e.g., a lithographic patterning process, evaporation techniques, sputtering techniques, chemical vapor deposition (CVD), atomic layer deposition (ALD), physical vapor deposition (PVD), molecular beam epitaxy (MBE), electrochemical deposition (ECD), etc.). Superconducting component(s) 104 can be formed on substrate 102 using a superconducting material such as, for example, niobium (Nb) and/or another superconducting material. Superconducting component(s) 104 can be formed on substrate 102 to create, for instance, one or more qubits, one or more components of a qubit, and/or one or more components of a superconducting circuit that can be coupled to such qubit(s) such as, for instance, one or more wires, electrodes, capacitors, resonators (e.g., bus resonators, transmission resonators, etc.), tuning gates, and/or another superconducting component.

In an example, device 100a can comprise a qubit device, where substrate 102 can comprise a silicon (Si) substrate having niobium (Nb) superconducting component(s) 104 formed thereon. In this example, one or more of the surfaces of device 100a can be oxidized by exposure to air, for instance, during processing. For example, a first oxide layer 106 comprising, for instance, silicon dioxide ($SiO_2$) can form on one or more surfaces of substrate 102 by exposure to air. In another example, a second oxide layer 108 comprising, for instance, niobium monoxide (NbO), niobium dioxide ($NbO_2$), and/or niobium pentoxide ($Nb_2O_5$) can form on one or more surfaces of superconducting component(s) 104 by exposure to air. As described below with reference to FIG. 1B, first oxide layer 106 and/or second oxide layer 108 can be removed using an etching process.

FIG. 1B illustrates a cross-sectional side view of the example, non-limiting device 100a of FIG. 1A after removal of the one or more oxide layers from one or more surfaces in accordance with one or more embodiments described herein. Repetitive description of like elements and/or processes employed in other embodiments described herein is omitted for sake of brevity.

Device 100b can comprise an example, non-limiting alternative embodiment of device 100a after removal of one or more oxide layers from one or more surfaces of device 100a. For example, first oxide layer 106 and/or second oxide layer 108 can be removed from one or more surfaces of substrate 102 and/or superconducting component(s) 104, respectively, as depicted in FIG. 1B. For instance, first oxide layer 106 can comprise silicon dioxide ($SiO_2$) that can be removed from one or more surfaces (e.g., a top surface) of substrate 102 comprising a silicon (Si) substrate. In another example, second oxide layer 108 can comprise niobium monoxide (NbO), niobium dioxide ($NbO_2$), niobium pentoxide ($Nb_2O_5$), and/or other suboxides that can be removed from one or more surfaces (e.g., top surface(s)) of superconducting component(s) 104 comprising niobium (Nb) superconducting component(s), such as, for instance, niobium (Nb) resonator(s).

In the examples described above, first oxide layer 106 and/or second oxide layer 108 can be removed from such surface(s) of such component(s) using an etching process. For instance, first oxide layer 106 and/or second oxide layer 108 can be removed from one or more surfaces of substrate 102 and/or superconducting component(s) 104 using a dilute etchant such as, for example, a dilute hydrogen fluoride (HF) etchant (dilute HF etchant) comprising a non-aqueous dilute HF etchant having trifluoroacetic acid ($CF_3CO_2H$) and/or another dilute etchant. In an example, first oxide layer 106 and/or second oxide layer 108 can be removed from one or more surfaces of substrate 102 and/or superconducting component(s) 104 using a dilute etchant solution (e.g., an aqueous hydrogen fluoride (HF) solution) comprising a dilute ranging from, for instance, approximately 1 percent (%) to approximately 10% aqueous hydrogen fluoride (HF). In another example, first oxide layer 106 and/or second oxide layer 108 can be removed from one or more surfaces of substrate 102 and/or superconducting component(s) 104 using a wet etch solution comprising a buffer etch containing ammonium fluoride ($NH_4F$). In these examples, substrate 102 can then be rinsed with deionized water to remove physically absorbed fluorides.

Using a dilute etchant (e.g., a non-aqueous dilute HF etchant having trifluoroacetic acid ($CF_3CO_2H$), etc.), to remove first oxide layer 106 and/or second oxide layer 108 from one or more surfaces of substrate 102 and/or superconducting component(s) 104, respectively, can also hydrogen-terminate (H-terminate) the surface(s) of substrate 102 (e.g., as depicted in FIG. 1B by the notation of the 3 "H" letters above substrate 102). For example, in embodiments where substrate 102 comprises a silicon (Si) substrate, use of such a dilute etchant defined above to remove first oxide layer 106 from a surface (e.g., a top surface) of substrate 102 can yield an H-terminated silicon (Si) surface that is a chemically passivated silicon (Si) surface of substrate 102 having silicon (Si) atoms that are covalently bonded to hydrogen (H) atoms.

In an example, second oxide layer 108 on one or more surfaces of superconducting component(s) 104 can be removed using an aqueous hydrogen fluoride (HF) of various concentration and/or a buffer etch containing ammonium fluoride ($NH_4F$) as described above. In another example, second oxide layer 108 on one or more surfaces of superconducting component(s) 104 can be removed by performing a dry etch process in a vacuum chamber using fluorinated gases including, but not limited to, carbon tetrafluoride ($CF_4$), sulfur hexafluoride ($SF_6$), and/or another fluorinated gas. In another example, first oxide layer 106 and/or second oxide layer 108 on one or more surfaces of substrate 102 and/or superconducting component(s) 104, respectively, can be removed using a combination of a wet etch process described above to remove first oxide layer 106 (e.g., silicon dioxide ($SiO_2$)) from such surface(s) of substrate 102 and a vacuum chamber annealing process at high temperature to remove second oxide layer 108 (e.g., niobium dioxide ($NbO_2$), niobium pentoxide ($Nb_2O_5$), and/or other suboxides) from such surface(s) of superconducting component(s) 104. For instance, temperatures ranging from approximately 250 Celsius (° C.) to approximately 400° C. can be used in the vacuum chamber annealing process. In some embodiments, temperatures of at least 250° C. and/or higher than 400° C. can be used in the vacuum chamber annealing process to remove second oxide layer 108 (e.g., niobium dioxide ($NbO_2$), niobium pentoxide ($Nb_2O_5$), and/or other suboxides) from such surface(s) of superconducting component(s) 104.

While first oxide layer 106 and/or second oxide layer 108 can be removed from one or more surfaces of substrate 102 and/or superconducting component(s) 104, respectively, using a dilute etchant as described above (e.g., a non-aqueous dilute HF etchant having trifluoroacetic acid ($CF_3CO_2H$), etc.), second oxide layer 108, which can comprise one or more niobium oxides (e.g., niobium monoxide (NbO), niobium dioxide ($NbO_2$), niobium pentoxide ($Nb_2O_5$), and/or other suboxides) can regrow rapidly in ambient atmosphere. For example, second oxide layer 108 illustrated in FIG. 1B can comprise a new oxide layer (e.g., niobium monoxide (NbO), niobium dioxide ($NbO_2$), niobium pentoxide ($Nb_2O_5$), and/or other suboxides) that has grown rapidly on superconducting component(s) 104 following removal of a similar oxide layer from device 100a using, for instance, a dilute etchant as described above. To prevent re-oxidation of one or more surfaces of substrate 102 (e.g., an H-terminated surface) and/or superconducting component(s) 104, such surface(s) can be reacted with one or more reactive organic compounds to form one or more self assembled monolayers (also referred to as self-assembled monolayers, self-limiting monolayers, etc.) on such surface(s) as described below with reference to FIG. 1C.

FIG. 1C illustrates a cross-sectional side view of the example, non-limiting device 100b of FIG. 1B after formation of one or more self assembled monolayers on the one or more surfaces of the substrate and/or the one or more superconducting components. Repetitive description of like elements and/or processes employed in other embodiments described herein is omitted for sake of brevity.

Device 100c can comprise an example, non-limiting alternative embodiment of device 100b after formation of one or more self assembled monolayers on one or more surfaces of substrate 102 and/or superconducting component(s) 104. For example, device 100c can comprise an example, non-limiting alternative embodiment of device 100b after formation of one or more self assembled monolayers on one or more surfaces of substrate 102 and/or superconducting component(s) 104 using a vapor phase based self assembled monolayer deposition process as described below.

To prevent re-oxidation of the one or more H-terminated surface(s) of substrate 102 (e.g., hydrogenated silicon (Si) surface(s)) and/or one or more surfaces of superconducting component(s) 104 (e.g., surface(s) of one or more niobium (Nb) superconducting component(s)), these surfaces can be reacted with reactive organic compounds to form one or more self assembled monolayers (also referred to as self-limiting monolayers) on such surfaces by covalent bonding. Formation of self assembled monolayers on such surfaces can also remove all dangling bonds, which are the vehicle for re-oxidation in ambient condition, as well as stabilize and/or encapsulate (e.g., seal) such surfaces to prevent regrowth of one or more of the oxides described above. It should be appreciated that such self assembled monolayers have properties including, but not limited to: strong silicon-carbon (Si—C) bond, which does not dissociate below 300 degrees Celsius (° C.); does not hydrolyze or oxidize under ambient condition; and/or is hydrophobic.

As described below, in embodiments where substrate 102 comprises a silicon (Si) substrate and superconducting component(s) 104 comprise niobium (Nb) superconducting component(s), such self assembled monolayers can be attached to one or more surfaces of substrate 102 (e.g., silicon (Si) surface(s)) and/or superconducting component(s) 104 (e.g., surface(s) comprising niobium oxides remaining after etching) using solution based deposition process and/or gas phase deposition process (also referred to as vapor phase deposition process). The specific chemistry of each of such one or more surfaces (e.g., silicon (Si) or niobium (Nb)) reacts the self assembled monolayer with the appropriate surface.

In an example, one or more etched surfaces of substrate 102 (e.g., surfaces comprising hydrogenated silicon) and/or superconducting component(s) 104 (e.g., surfaces comprising niobium oxide(s)) of device 100b can be reacted with one or more reactive organic compounds at moderate temperatures (e.g., temperatures ranging from approximately 120° C. to approximately 200° C.) to form a covalently bonded self assembled monolayer on such surface(s). In another example, one or more etched surfaces of substrate 102 (e.g., surfaces comprising hydrogenated silicon) and/or superconducting component(s) 104 (e.g., surfaces comprising niobium oxide(s)) of device 100b can be reacted with one or more reactive organic compounds using ultraviolet radiation to form a covalently bonded self assembled monolayer on such surface(s). The one or more reactive organic compounds described herein in accordance with one or more embodiments of the subject disclosure can include, but are not limited to, alkynes (e.g., 1-alkynes), alkenes (e.g., 1-alkenes), alcohols, thiols, and/or another reactive organic compound.

The chain length of such reactive organic compounds defined above can vary from, for instance, 1-18 carbon (C) atoms. Of the reactive organic compounds defined above, only thiols can react with surfaces having hydrogenated silicon (Si) (e.g., H-terminated surface(s) of substrate 102) and surfaces having niobium oxides that can remain after etching (e.g., surfaces of superconducting component(s) 104 having niobium monoxide (NbO), niobium dioxide (NbO$_2$), niobium pentoxide (Nb$_2$O$_5$), and/or other suboxides). The other reactive organic compounds defined above (e.g., alkynes, alkenes, and alcohols) can only react with surfaces having hydrogenated silicon (Si) to form a self assembled monolayer with silicon-carbon (Si—C) or silicon-oxygen (Si—O) bond between the surface and long chain hydrocarbon. The solvents defined above can have higher boiling points than the heating temperature used for bonding and can be inert toward both the surface and the reactive organic compounds used for self assembly.

As depicted in FIG. 1C, in embodiments where substrate 102 comprises a silicon (Si) substrate and superconducting component(s) 104 comprise niobium (Nb) superconducting component(s), formation of one or more self assembled monolayers on one or more surfaces of substrate 102 (e.g., silicon (Si) surface(s)) and/or superconducting component(s) 104 (e.g., surface(s) comprising niobium oxides remaining after etching) can be achieved using a vapor phase deposition process (e.g., a vapor phase based self assembled monolayer deposition process). For example, vapors 110 comprising perfluorodecene (PFD) can be applied to such surface(s) of substrate 102 and/or superconducting component(s) 104 of device 100b to facilitate self assembly of long chain reactive organic compounds (denoted as $R_f$ in FIG. 1C) on one or more surface(s) of device 100c as depicted in FIG. 1C. For instance, to form such self assembled monolayers, device 100b having etched surfaces of substrate 102 and/or superconducting component(s) 104 can be immediately transferred (e.g., after etching as described above) to a vacuum chamber and exposed to vapors 110 of one or more of the reactive organic materials defined above while substrate 102 is heated at moderately high temperatures (e.g., temperatures ranging from approximately 100° C. to approximately 180° C.).

FIG. 2 illustrates a cross-sectional side view of the example, non-limiting device 100b of FIG. 1B after formation of one or more self assembled monolayers on the one or more surfaces of the substrate and/or the one or more superconducting components. Repetitive description of like elements and/or processes employed in other embodiments described herein is omitted for sake of brevity.

Device 200 can comprise an example, non-limiting alternative embodiment of device 100b after formation of one or more self assembled monolayers on one or more surfaces of substrate 102 and/or superconducting component(s) 104. For example, device 200 can comprise an example, non-limiting alternative embodiment of device 100b after formation of one or more self assembled monolayers on one or more surfaces of substrate 102 and/or superconducting component(s) 104 using a solution based self assembled monolayer deposition process as described below.

Based on removing first oxide layer 106 and/or second oxide layer 108 from device 100b as described above, then rinsing and drying device 100b under a stream of nitrogen (N), device 100b can be immersed in a solution 202 comprising one or more of the reactive organic compounds defined above in a solvent. Based on such immersion of device 100b in solution 202, device 100b can be heated under nitrogen (N) atmosphere at moderately high temperature ranging from approximately 100° C. to approximately 140° C. to complete covalent bond formation of organic compound (denoted as $R_f$ in FIG. 2) with the etched surfaces of device 100b and thereby form device 200 illustrated in FIG. 2.

Figure 3A:
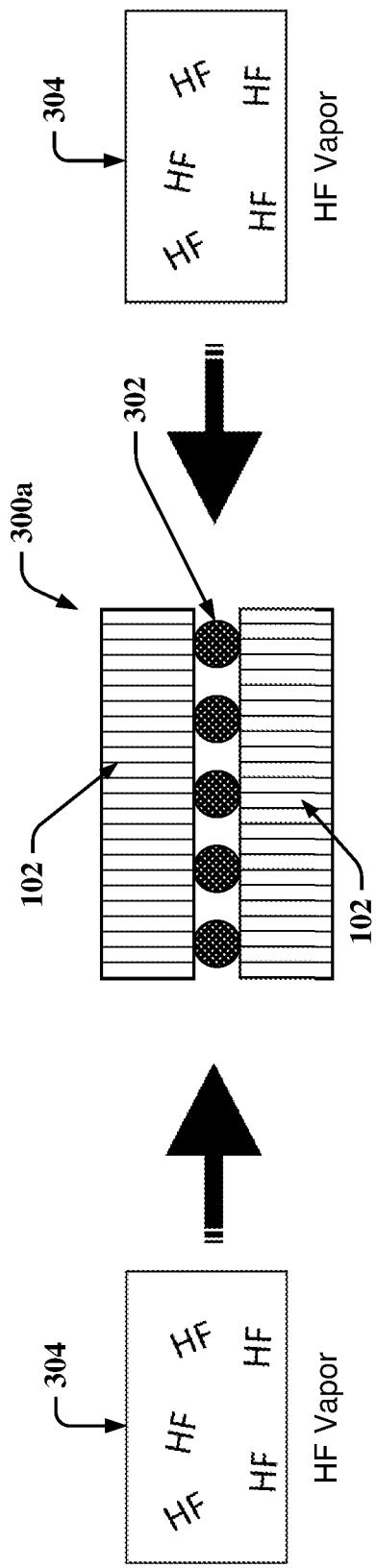
FIG. 3A illustrates a cross-sectional side view of example, non-limiting device that can comprise bump bonded device having one or more oxide layers on one or more substrates and/or on one or more superconducting components formed on the one or more substrates in accordance with one or more embodiments described herein.

FIG. 3A illustrates a cross-sectional side view of example, non-limiting devices 300 that can comprise bump bonded device having one or more oxide layers on one or more substrates and/or on one or more superconducting components formed on the one or more substrates in accordance with one or more embodiments described herein. Repetitive description of like elements and/or processes employed in other embodiments described herein is omitted for sake of brevity.

Device 300a can comprise an example, non-limiting alternative embodiment of device 100a and/or device 100b after further developing device 100a into a bump bonded device and removing one or more oxide layers from device 300a. For example, device 300a can comprise an example, non-limiting alternative embodiment of device 100a and/or device 100b after further developing device 100a into a bump bonded device using a bump bonding process (e.g., a flip chip process) to bond two substrates 102 with bumps 302 (e.g., solder bumps) as depicted in FIG. 3A and further applying a vapor etchant to device 300a to remove one or more oxide layers (e.g., silicon dioxide (SiO$_2$), niobium monoxide (NbO), niobium dioxide (NbO$_2$), niobium pentoxide (Nb$_2$O$_5$), etc.) from device 300a.

Substrates 102 of device 300a can comprise silicon (Si) substrates having one or more superconducting component(s) 104 formed thereon (not illustrated in FIGS. 3A and 3B), where such superconducting component(s) 104 can be formed on such substrates 102 as described above with reference to FIG. 1A and prior to employing a bump bonding process to bond substrates 102 using bumps 302. One or more surfaces of substrates 102 and/or superconducting component(s) 104 can have first oxide layer 106 and/or second oxide layer 108 (not illustrated in FIGS. 3A and 3B), respectively, formed thereon by exposure of such surface(s) to air as described above with reference to FIG. 1A. As depicted in FIG. 3A, a vapor etchant 304 can be applied to device 300a to remove first oxide layer 106 and/or second oxide layer 108. For example, vapor etchant 304 can comprise a vapor hydrogen fluoride (HF) etchant that can be applied to device 300a such that it penetrates the spaces between substrates 102 and/or bumps 302 that can be inaccessible via solution deposition.

Figure 3B:
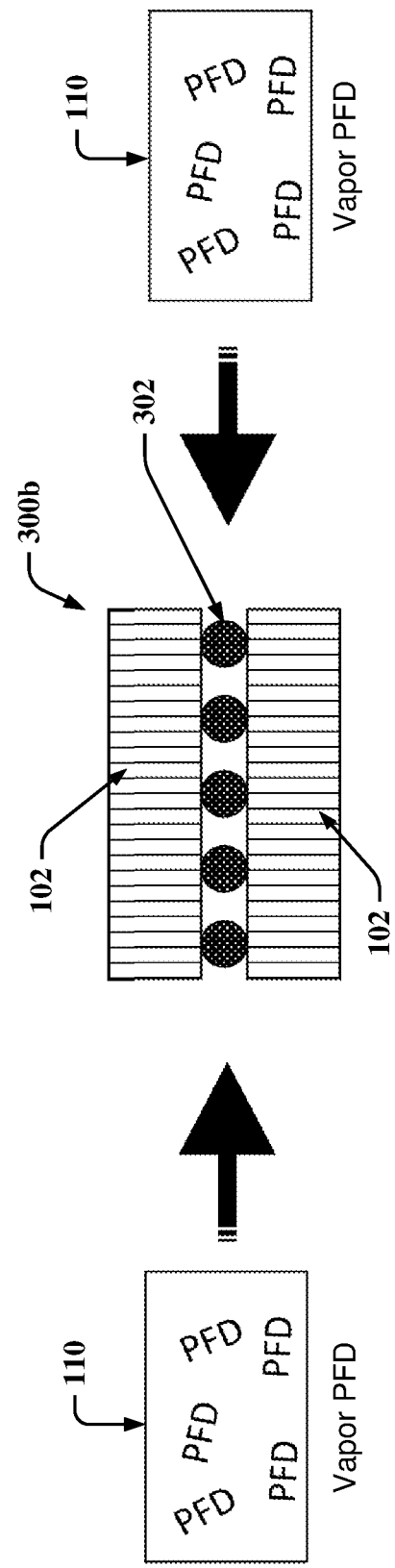
FIG. 3B illustrates a cross-sectional side view of the example, non-limiting device of FIG. 3A after formation of one or more self assembled monolayers on one or more surfaces of the one or more substrates and/or the one or more superconducting components formed on the one or more substrates in accordance with one or more embodiments described herein.

FIG. 3B illustrates a cross-sectional side view of the example, non-limiting device 300a of FIG. 3A after formation of one or more self assembled monolayers on one or more surfaces of the one or more substrates and/or the one or more superconducting components formed on the one or more substrates in accordance with one or more embodiments described herein. Repetitive description of like elements and/or processes employed in other embodiments described herein is omitted for sake of brevity.

Device 300b can comprise an example, non-limiting alternative embodiment of device 300a after formation of one or more self assembled monolayers (not illustrated in FIG. 3B) on one or more surfaces of substrates 102 and/or superconducting component(s) 104. In an example, device 300b can comprise an example, non-limiting alternative embodiment of device 300a after formation of one or more self assembled monolayers on one or more surfaces of substrates 102 and/or superconducting component(s) 104 using a vapor phase based self assembled monolayer deposition process. For example, vapors 110 comprising perfluorodecene (PFD) can be applied to such surface(s) of substrates 102 and/or superconducting component(s) 104 of device 300b as depicted in FIG. 3B to facilitate self assembly of long chain reactive organic compounds on such surface(s) of device 300b as described above with reference to FIG. 1C. For instance, to form such self assembled monolayers, device 300a having etched surfaces of substrates 102 and/or superconducting component(s) 104 can be immediately transferred (e.g., after etching as described above) to a vacuum chamber and exposed to vapors 110 of one or more of the reactive organic materials defined above while substrates 102 are heated at moderately high temperatures (e.g., temperatures ranging from approximately 100° C. to approximately 180° C.). In these examples, vapors 110 (e.g., vapor PFD) can be applied to device 300b such that they penetrate the spaces between substrates 102 and/or bumps 302 that can be inaccessible via solution deposition.

Figure 4:
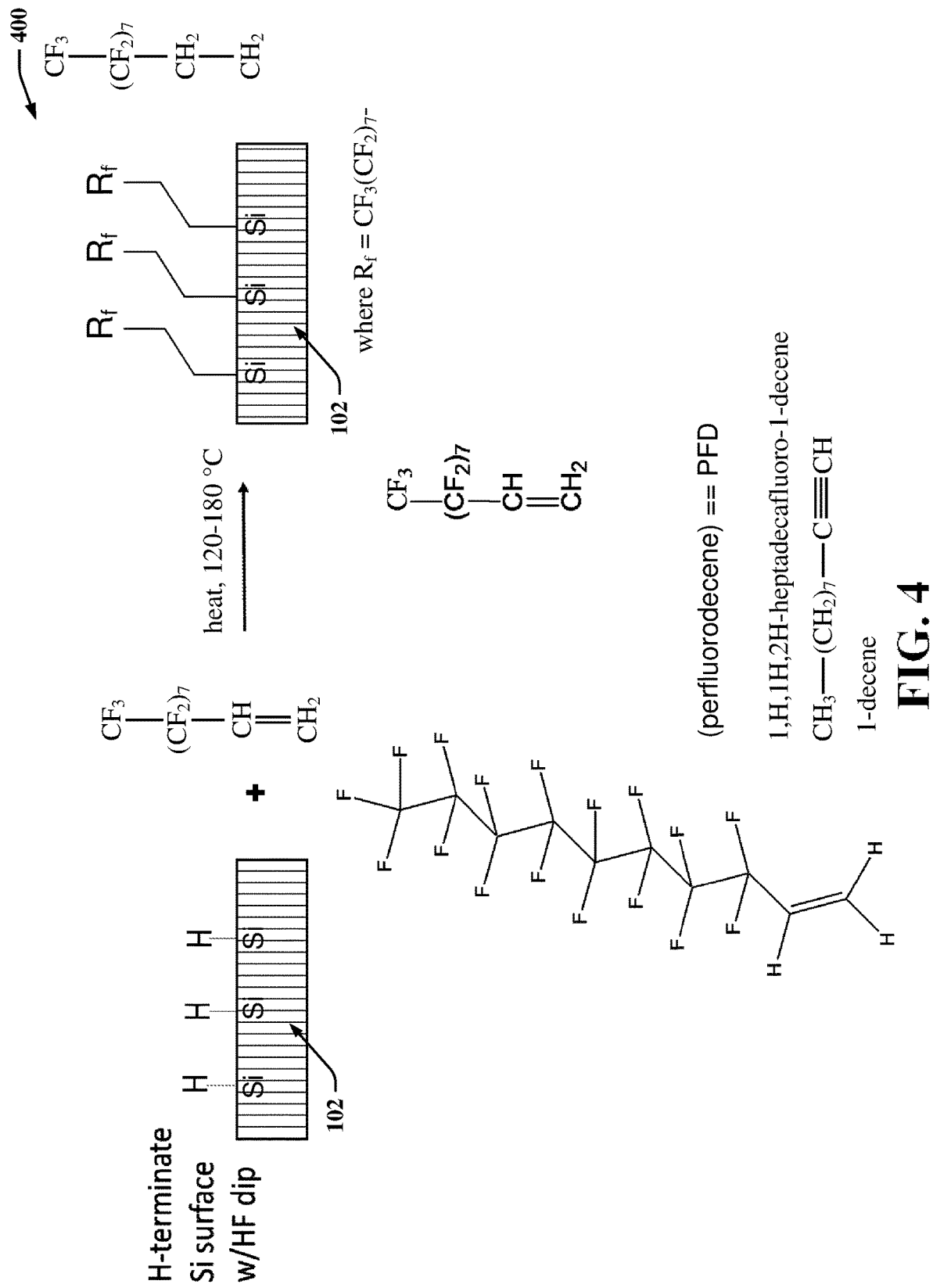
FIG. 4 illustrates a diagram of an example, non-limiting method that can facilitate H-termination of a silicon (Si) substrate surface and formation of one or more self assembled monolayers on such a surface in accordance with one or more embodiments described herein.

FIG. 4 illustrates a diagram of an example, non-limiting method 400 that can facilitate H-termination of a silicon (Si) substrate surface and formation of one or more self assembled monolayers on such a surface in accordance with one or more embodiments described herein. Repetitive description of like elements and/or processes employed in other embodiments described herein is omitted for sake of brevity.

Method 400 depicted in FIG. 4 can comprise a method to H-terminate a silicon (Si) surface of substrate 102 comprising a silicon (Si) substrate. For example, method 400 can comprise using a dilute HF etchant to H-terminate a silicon (Si) surface of substrate 102 comprising a silicon (Si) substrate as described above with reference to FIGS. 1A and 1B.

Method 400 depicted in FIG. 4 can further comprise a method to attach a self assembled monolayer onto an H-terminated silicon (Si) surface of substrate 102 (e.g., following etching as described above). For example, method 400 can comprise attaching a self assembled monolayer (e.g., a self assembled fluorinated alkene, a perfluorodecene (PFD), etc.) onto an H-terminated silicon (Si) surface of substrate 102 (e.g., following etching as described above) using a vapor phase based self assembled monolayer deposition process (e.g., using vapors 110) as described above with reference to FIGS. 1C and 3B.

Figure 5:
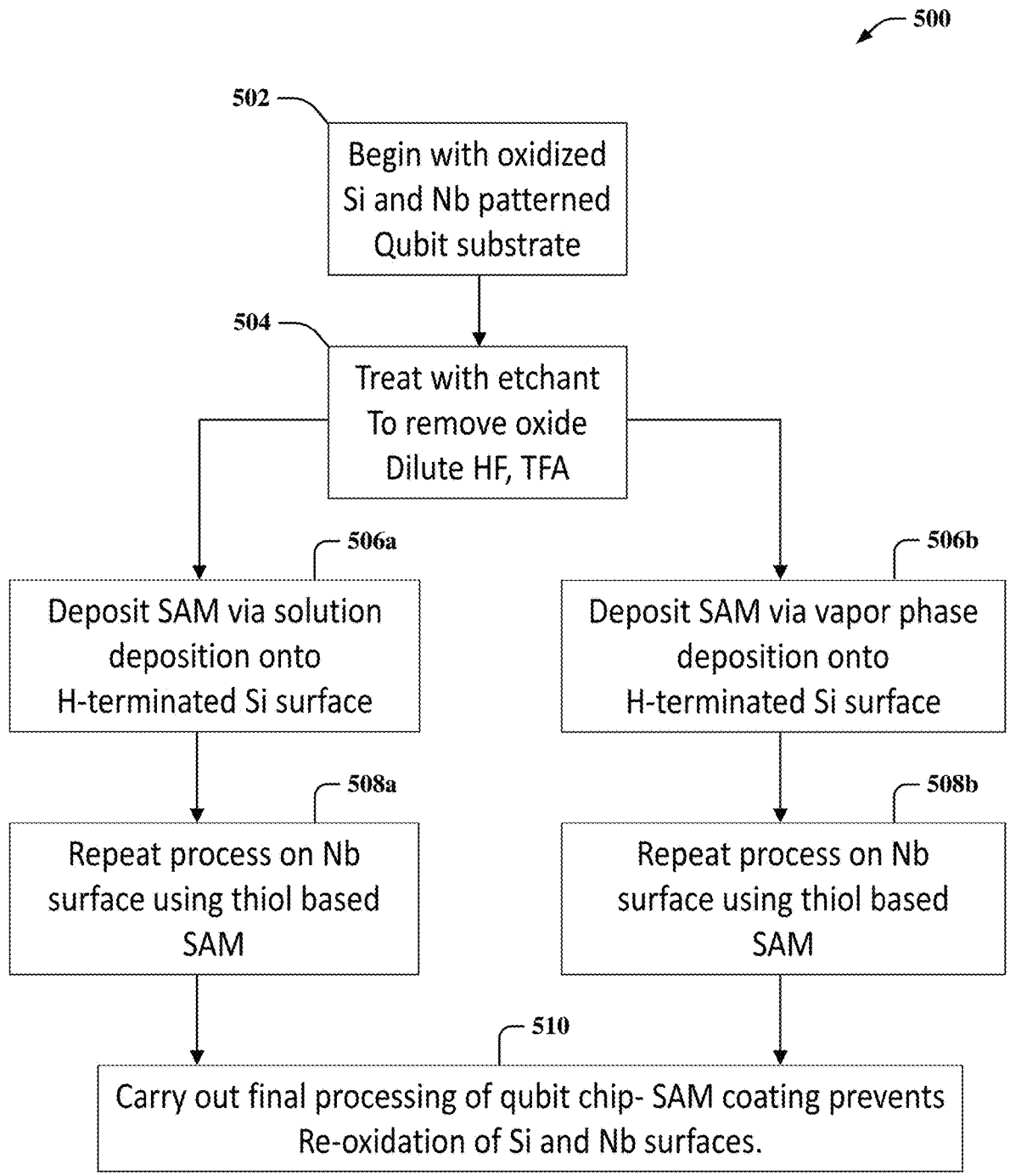
FIG. 5 illustrates a flow diagram of an example, non-limiting method that can facilitate formation of a self assembled monolayer on a quantum device in accordance with one or more embodiments described herein.

FIG. 5 illustrates a flow diagram of an example, non-limiting method 500 that can facilitate formation of a self assembled monolayer on a quantum device in accordance with one or more embodiments described herein. Repetitive description of like elements and/or processes employed in other embodiments described herein is omitted for sake of brevity.

At 502, method 500 can comprise beginning with an oxidized silicon (Si) and niobium (Nb) patterned qubit substrate. For example, at 502, method 500 can comprise beginning with a device such as, for instance, device 100a and/or device 300a described above with reference to FIGS. 1A and 3A, respectively, where such device(s) can comprise substrate 102 (e.g., a silicon (Si) substrate) and/or superconducting component(s) 104 (e.g., niobium (Nb) superconducting components) having first oxide layer 106 (e.g., silicon dioxide ($SiO_2$)) and/or second oxide layer 108 (e.g., niobium monoxide (NbO), niobium dioxide ($NbO_2$), niobium pentoxide ($Nb_2O_5$), and/or other suboxides), respectively, formed thereon.

At 504, method 500 can comprise treating with etchant to remove oxide(s) using, for instance, a non-aqueous dilute HF etchant having trifluoroacetic acid ($CF_3CO_2H$). For example, as described above with reference to FIGS. 1A, 1B, and 3A, device 100a and/or device 300a can be treated with a non-aqueous dilute HF etchant having trifluoroacetic acid ($CF_3CO_2H$) to remove first oxide layer 106 and/or second oxide layer 108 from one or more surfaces of such device(s) and/or to H-terminate a silicon (Si) surface of substrate 102.

At 506a, method 500 can comprise depositing a self assembled monolayer (SAM) via solution deposition onto H-terminated silicon (Si) surface. For example, as described above with reference to FIG. 2, one or more self assembled monolayers can be formed (e.g., deposited, assembled, grown, etc.) on one or more surfaces of device 100b using, for instance, a solution based self assembled monolayer deposition process (e.g., solution 202 comprising one or more of the reactive organic compounds defined above in a solvent).

At 506b, method 500 can comprise depositing a self assembled monolayer (SAM) via vapor phase deposition onto H-terminated silicon (Si) surface. For example, as described above with reference to FIGS. 1B, 1C, 3A, and 3B, one or more self assembled monolayers can be formed (e.g., deposited, assembled, grown, etc.) on device 100b and/or device 300a using, for instance, a vapor phase based self assembled monolayer deposition process (e.g., vapors 110 comprising, for instance, PFD, one or more of the reactive organic materials defined above with reference to FIG. 1C, etc.).

At 508a, method 500 can comprise repeating the process on niobium (Nb) surface(s) using thiol based self assembled monolayer (SAM). For example, with reference to FIG. 2, at 508a, method 500 can comprise repeating the deposition step of 506a, where a thiol based self assembled monolayer can be deposited (e.g., formed, assembled, grown, etc.) on one or more surfaces of superconducting component(s) 104 comprising niobium (Nb) superconducting component(s) using, for instance, a solution based self assembled monolayer deposition process (e.g., solution 202 comprising one or more of the reactive organic compounds defined above in a solvent).

At 508b, method 500 can comprise repeating the process on niobium (Nb) surface(s) using thiol based self assembled monolayer (SAM). For example, with reference to FIGS. 1C and 3B, at 508b, method 500 can comprise repeating the deposition step of 506b, where a thiol based self assembled monolayer can be deposited (e.g., formed, assembled, grown, etc.) on one or more surfaces of superconducting component(s) 104 comprising niobium (Nb) superconducting component(s) using, for instance, a vapor phase based self assembled monolayer deposition process (e.g., vapors 110 comprising, for instance, PFD, one or more of the reactive organic materials defined above with reference to FIG. 1C, etc.).

At 510, method 500 can comprise carrying out final processing of qubit chip, where the self assembled monolayer (SAM) coating prevents re-oxidation of silicon (Si) and niobium (Nb) surfaces. For example, at 510, method 500 can comprise carrying out final processing such as, for instance, packaging of a qubit chip that can comprise, for instance, device 100c, 200, and/or 300b described above with reference to FIGS. 1C, 2, and 3B.

Figure 6A:
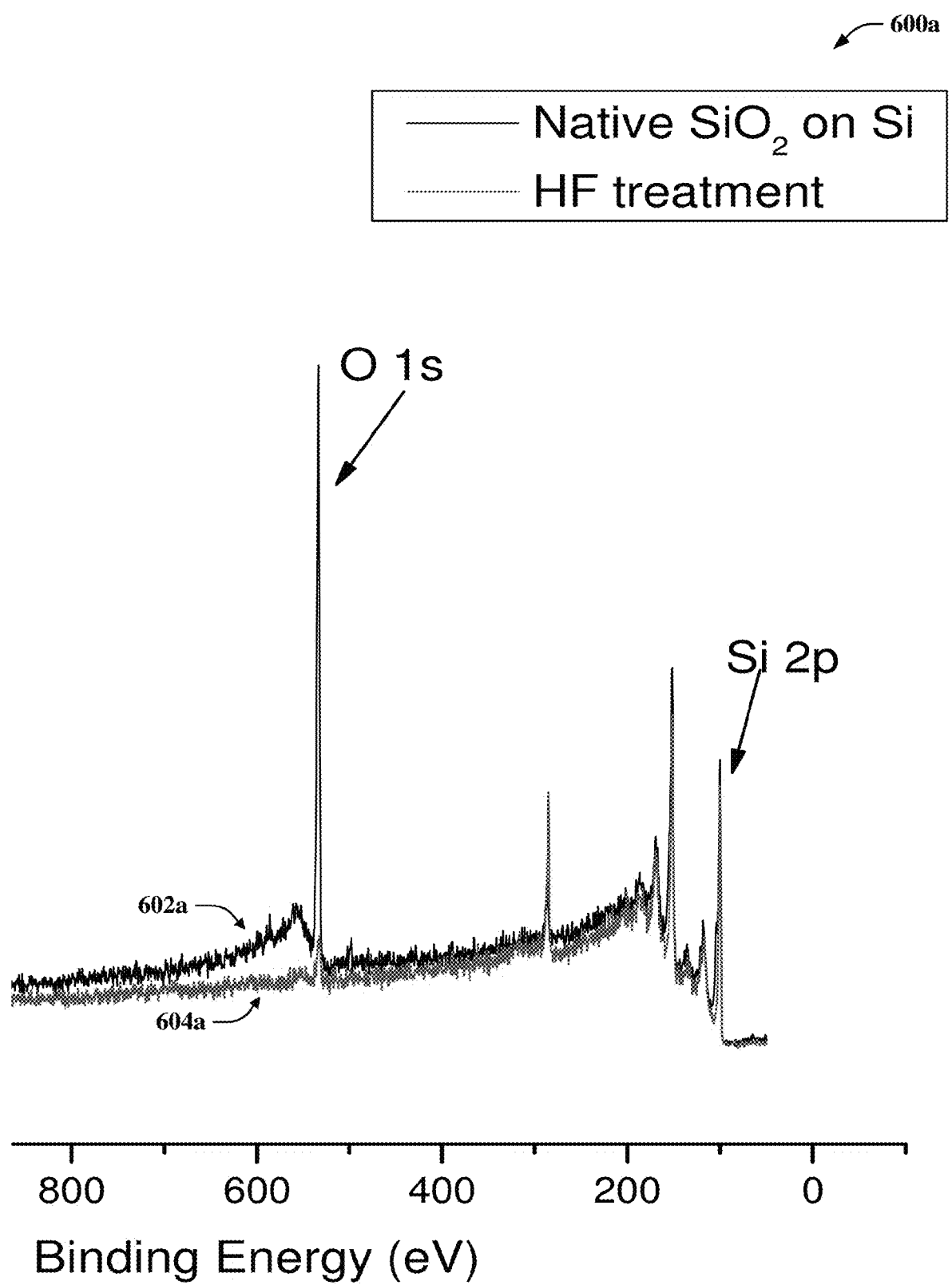
FIGS. 6A, 6B, and 6C illustrate diagrams of example, non-limiting information that can comprise experimental data from implementation of a quantum device comprising a self assembled monolayer formed on the quantum device in accordance with one or more embodiments described herein.
Figure 6B:
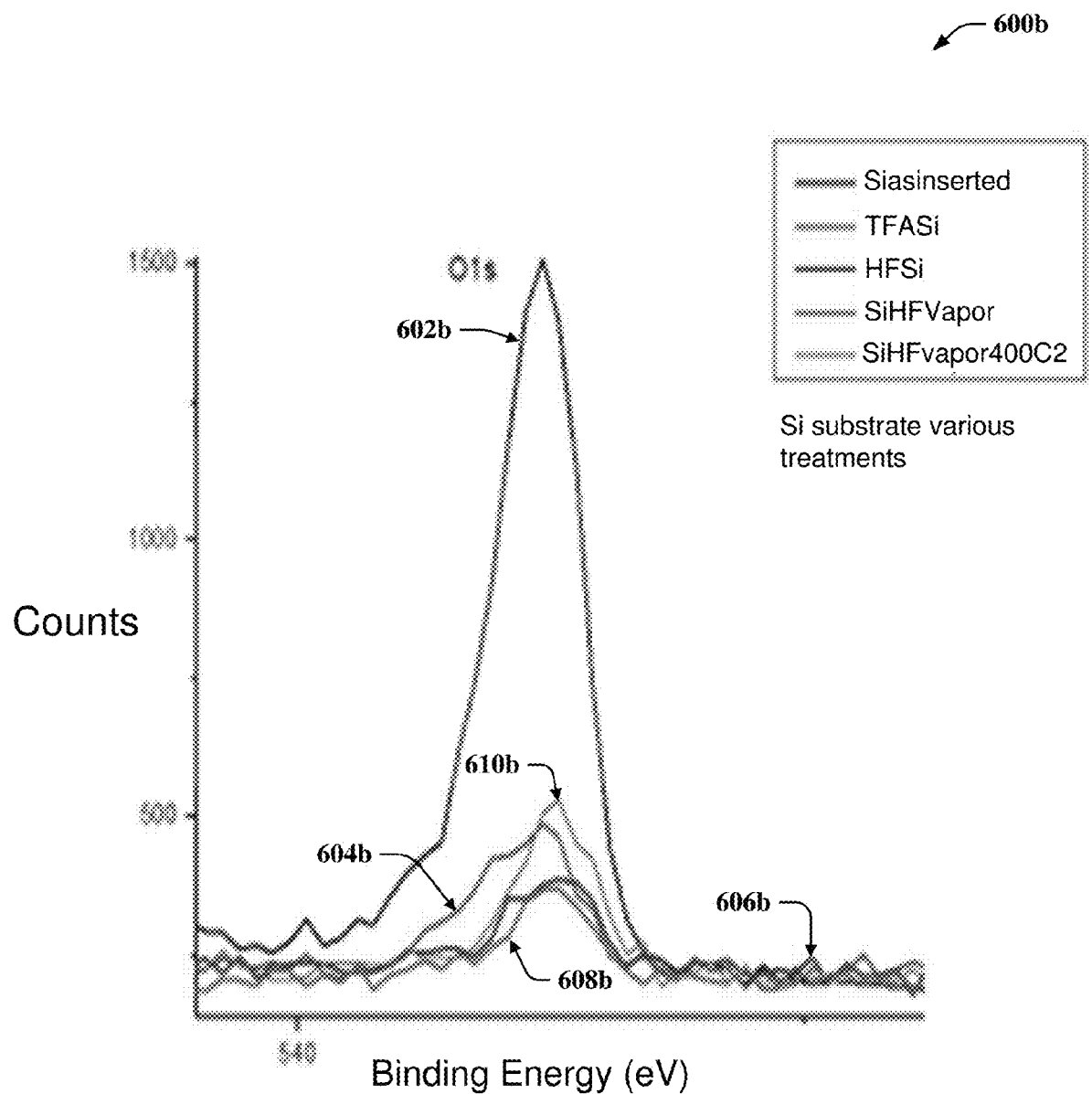
Figure 6C:
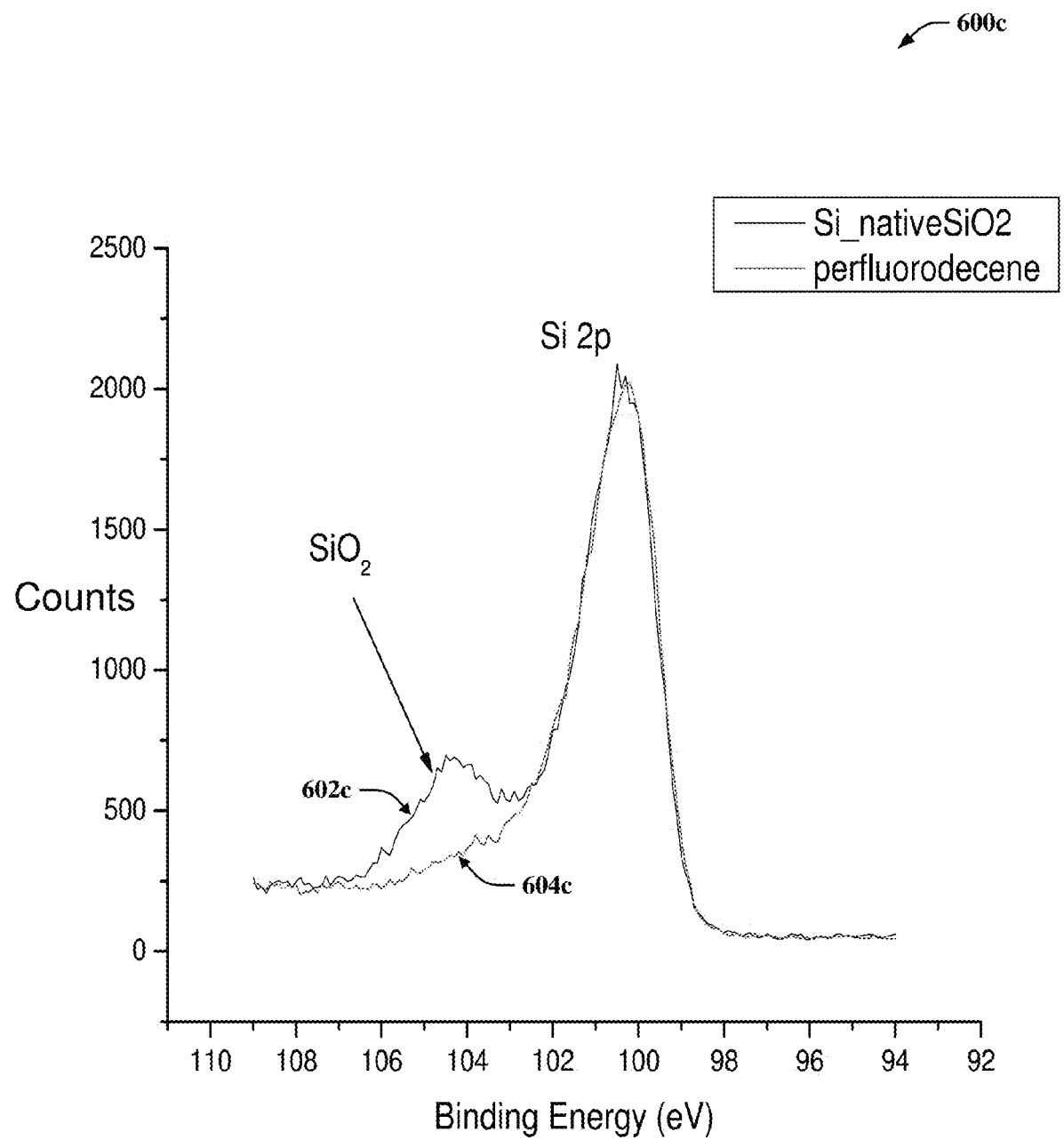

FIGS. 6A, 6B, and 6C illustrate diagrams of example, non-limiting information 600a, 600b, 600c that can comprise experimental data from implementation of a quantum device comprising a self assembled monolayer formed on the quantum device in accordance with one or more embodiments described herein. Repetitive description of like elements and/or processes employed in other embodiments described herein is omitted for sake of brevity.

Information 600a, 600b, 600c can comprise X-ray photoelectron spectra illustrating experimental data from implementation of a quantum device comprising a self assembled monolayer formed on the quantum device in accordance with one or more embodiments described herein.

Information 600a illustrated in FIG. 6A depicts oxidized silicon (Si) as plot 602a and dramatic reduction of oxygen (O is core level) and H-terminated silicon (Si) as plot 604a following etch with either dilute HF or trifluoroacetic acid.

Information 600b illustrated in FIG. 6B comprises a spectrum depicting intensity reduction in oxygen O1s signal indicating removal of silicon dioxide ($SiO_2$) from a silicon (Si) substrate using various oxide removal treatments as illustrated by plots 604b, 606b, 608b, and 610b. Plot 602b illustrated in FIG. 6B denotes intensity of oxygen O1s signal obtained from a silicon (Si) substrate as inserted. Plot 604b illustrated in FIG. 6B denotes intensity reduction of oxygen O1s signal obtained from a silicon (Si) substrate following treatment with trifluoroacetic acid (TFA). Plot 606b illustrated in FIG. 6B denotes intensity reduction of oxygen O1s signal obtained from a silicon (Si) substrate following treatment with an HF solution comprising 10 percent (10%) HF in water ($H_2O$). Plot 608b illustrated in FIG. 6B denotes intensity reduction of oxygen O1s signal obtained from a silicon (Si) substrate following treatment with an HF vapor. Plot 610b illustrated in FIG. 6B denotes intensity reduction of oxygen O1s signal obtained from a silicon (Si) substrate following treatment with an HF vapor followed by 400° C. anneal.

Information 600c illustrated in FIG. 6C comprises a spectrum depicting the silicon Si $2p$ core level for oxidized silicon (Si) showing the chemically shifted core level component associated with silicon dioxide ($SiO_2$) at 104 electron volts (eV) binding energy as plot 602c and the same silicon Si $2p$ core level following etch and deposition of the perfluorodecene SAM as plot 604c showing that the oxide has been removed and does not grow back following air exposure.

Figure 7A:
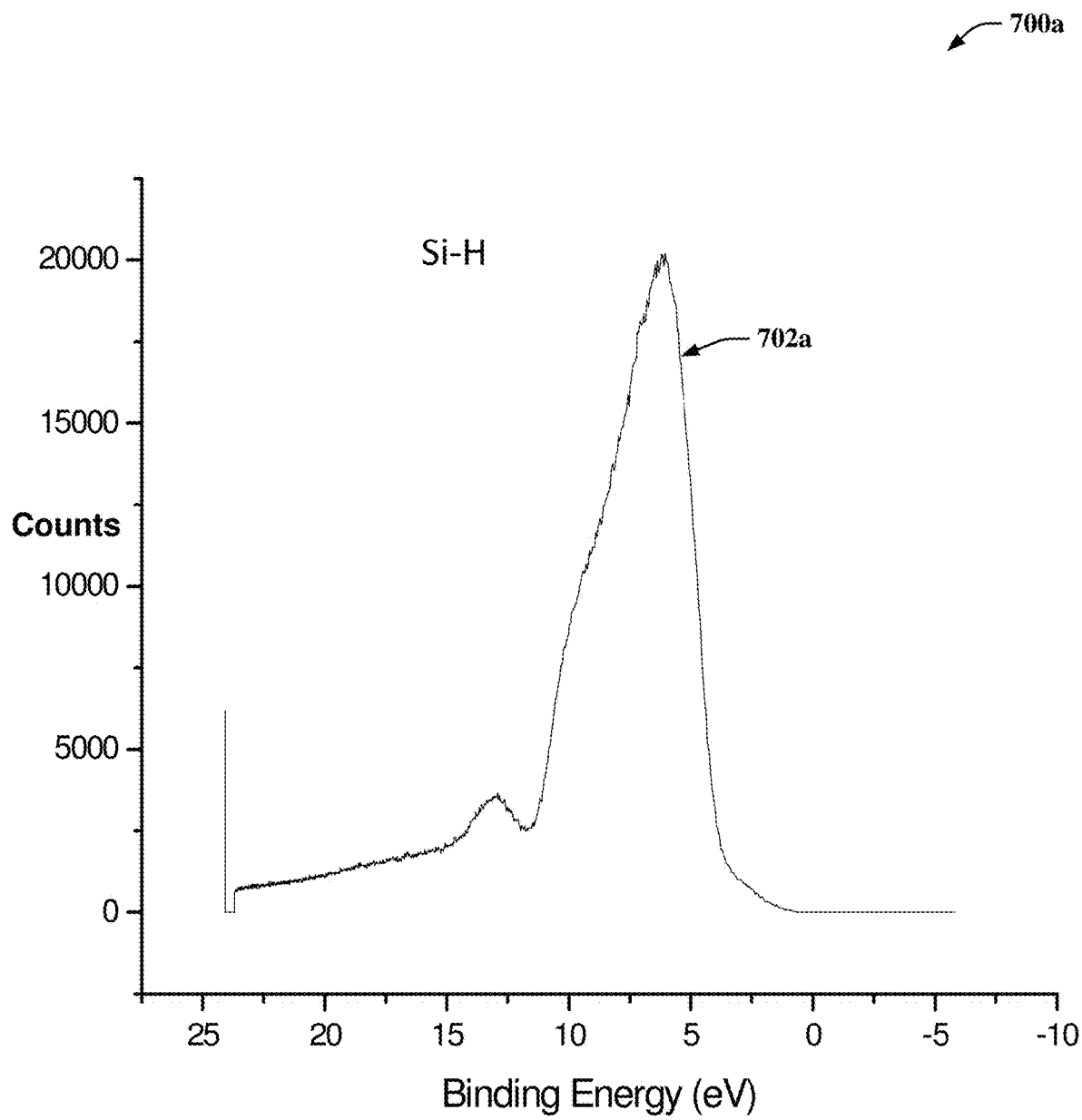
FIG. 7A illustrates a diagram of an example, non-limiting information that can comprise experimental data from implementation of a quantum device comprising an H-terminated surface following removal of an oxide layer in accordance with one or more embodiments described herein.

FIG. 7A illustrates a diagram of an example, non-limiting information 700a that can comprise experimental data from implementation of a quantum device comprising an H-terminated surface following removal of an oxide layer in accordance with one or more embodiments described herein. Repetitive description of like elements and/or processes employed in other embodiments described herein is omitted for sake of brevity.

Information 700a can comprise an ultraviolet photoelectron spectra as plot 702a illustrating experimental data from implementation of a quantum device comprising an H-terminated silicon (Si) surface formed by removing silicon dioxide ($SiO_2$) using a non-aqueous dilute HF etchant having trifluoroacetic acid ($CF_3CO_2H$) in accordance with one or more embodiments described herein.

Figure 7B:
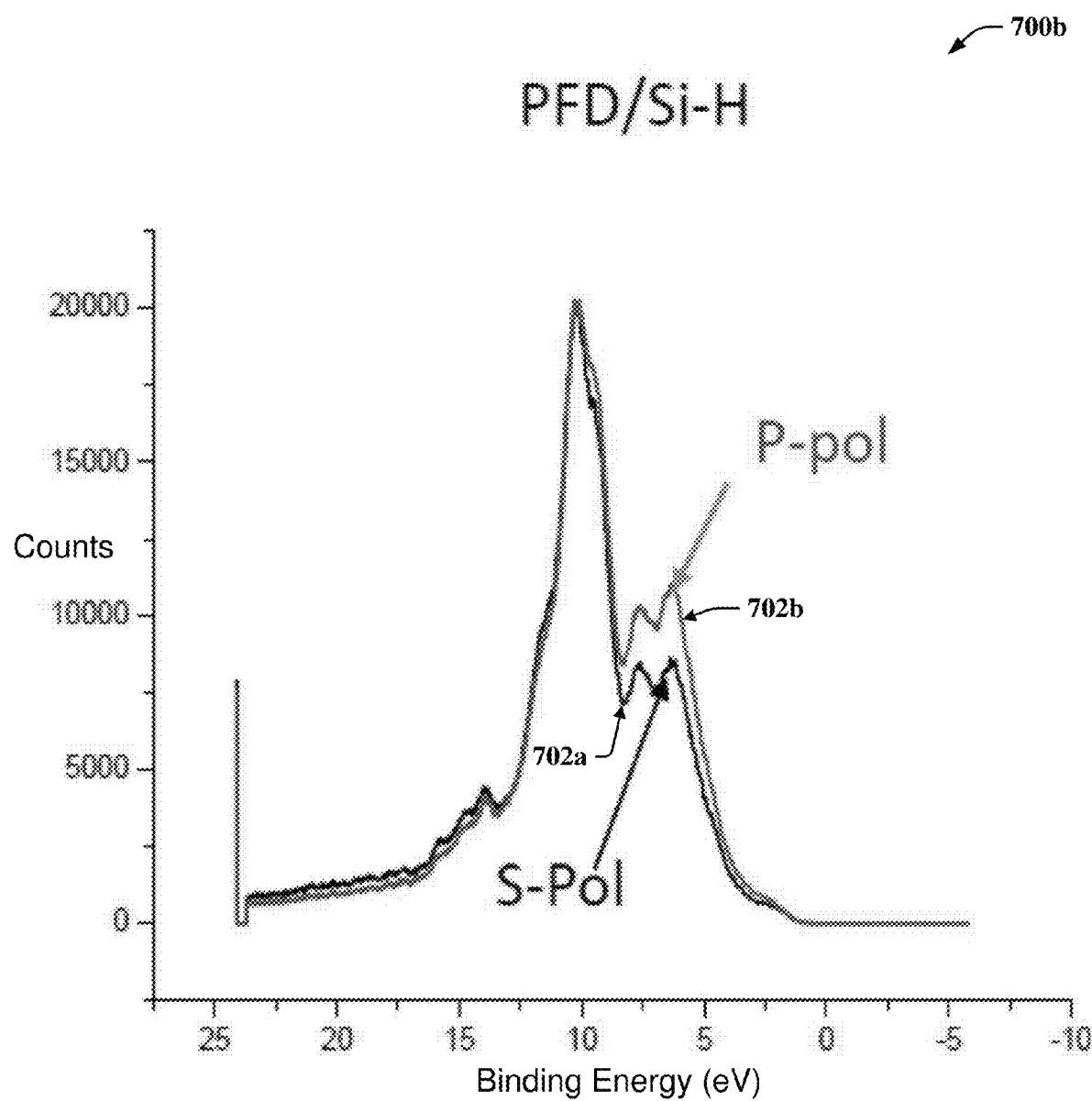
FIG. 7B illustrates a diagram of an example, non-limiting information that can comprise experimental data from implementation of a quantum device comprising a self assembled monolayer formed on the quantum device in accordance with one or more embodiments described herein.

FIG. 7B illustrates a diagram of an example, non-limiting information 700b that can comprise experimental data from implementation of a quantum device comprising a self assembled monolayer formed on the quantum device in accordance with one or more embodiments described herein. Repetitive description of like elements and/or processes employed in other embodiments described herein is omitted for sake of brevity.

Information 700b can comprise an ultraviolet photoelectron spectra illustrating experimental data from implementation of a quantum device comprising a self assembled monolayer formed on the quantum device in accordance with one or more embodiments described herein. Information 700b can comprise an ultraviolet photoelectron spectra of a perfluorodecene (PFD) self assembled monolayer coated silicon (Si) surface (e.g., a coated silicon (Si) surface of substrate 102). The molecular structure of the PFD is shown in the changed spectra. Spectra denoted by plot 702b and plot 704b are collected with light of different polarizations (denoted P-pol and S-Pol in FIG. 7B) and the differences reveal ordering of the self assembled monolayer (SAM) on the silicon (Si) surface.

Figure 7C:
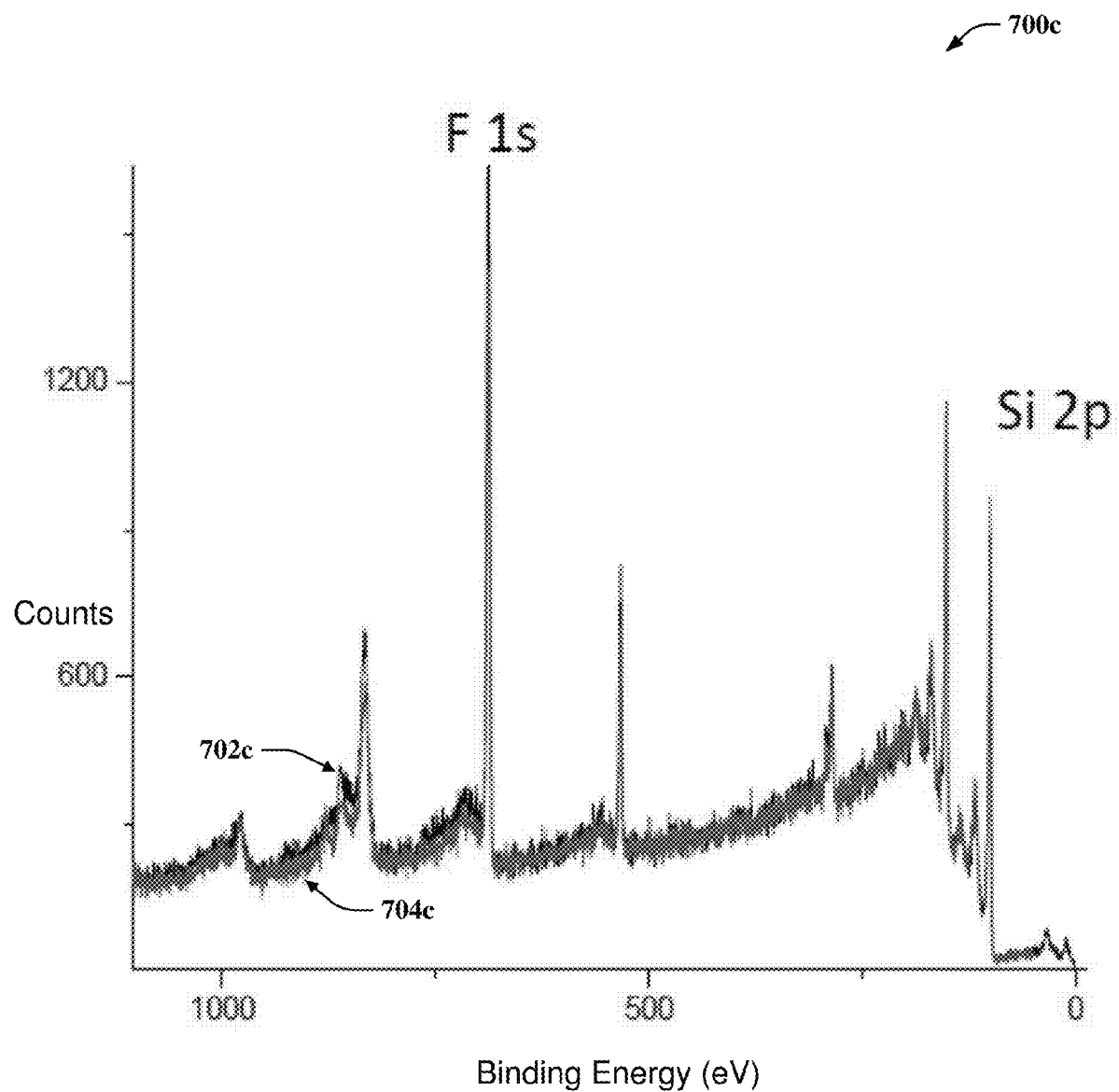
FIG. 7C illustrates a diagram of an example, non-limiting information that can comprise experimental data from implementation of a quantum device comprising a self assembled monolayer formed on the quantum device in accordance with one or more embodiments described herein.

FIG. 7C illustrates a diagram of an example, non-limiting information 700c that can comprise experimental data from implementation of a quantum device comprising a self assembled monolayer formed on the quantum device in accordance with one or more embodiments described herein. Repetitive description of like elements and/or processes employed in other embodiments described herein is omitted for sake of brevity.

Information 700c can comprise an X-ray photoelectron spectra illustrating experimental data from implementation of a quantum device comprising a self assembled monolayer formed on the quantum device in accordance with one or more embodiments described herein. Information 700c can comprise an X-ray photoelectron spectra of a perfluorodecene (PFD) self assembled monolayer coated silicon (Si) surface (e.g., a coated silicon (Si) surface of substrate 102). Plot 702c illustrated in FIG. 7C denotes an X-ray photoelectron spectra of a perfluorodecene (PFD) self assembled monolayer coated on a silicon (Si) surface (e.g., a coated silicon (Si) surface of substrate 102) that has been treated with trifluoroacetic acid (TFA) for 3 minutes prior to PFD treatment for 60 minutes. Plot 704c illustrated in FIG. 7C denotes an X-ray photoelectron spectra of a perfluorodecene (PFD) self assembled monolayer coated on a silicon (Si) surface (e.g., a coated silicon (Si) surface of substrate 102) that has been treated with trifluoroacetic acid (TFA) for 8 minutes prior to PFD treatment for 60 minutes. The F is core level depicted in FIG. 7C is further indication of PFD self assembled monolayer.

Figure 8:
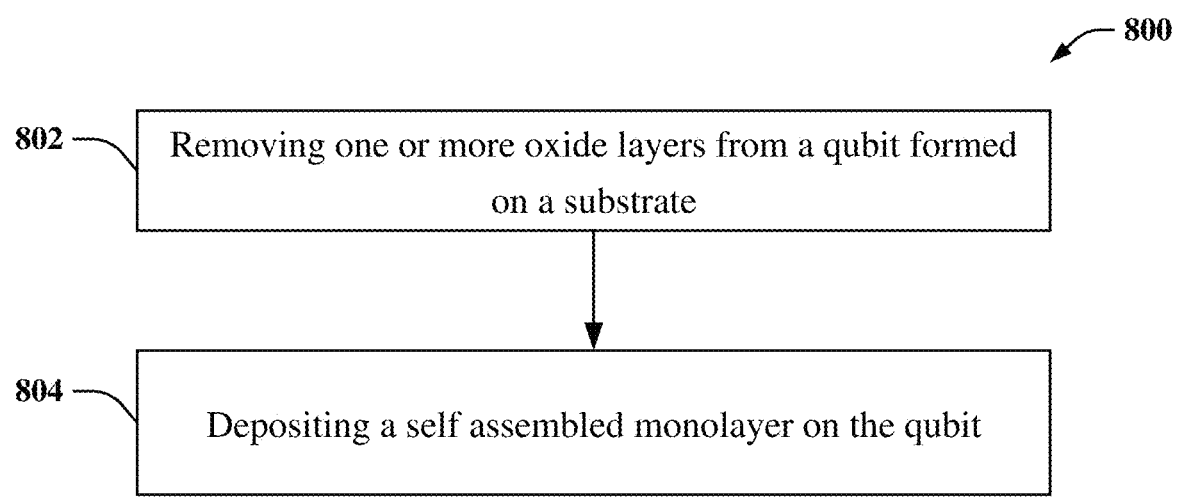
FIG. 8 illustrates a flow diagram of an example, non-limiting computer-implemented method that can facilitate formation of a self assembled monolayer on a quantum device in accordance with one or more embodiments described herein.

FIG. 8 illustrates a flow diagram of an example, non-limiting computer-implemented method 800 that can facilitate formation of a self assembled monolayer on a quantum device in accordance with one or more embodiments described herein. Repetitive description of like elements and/or processes employed in other embodiments described herein is omitted for sake of brevity.

At 802, computer-implemented method 800 can comprise removing one or more oxide layers from a qubit formed on a substrate. For example, with reference to FIGS. 1A, 1B, and 3A, at 802, computer-implemented method 800 can comprise removing first oxide layer 106 (e.g., silicon dioxide ($SiO_2$)) and/or second oxide layer 108 (e.g., niobium dioxide ($NbO_2$), niobium pentoxide ($Nb_2O_5$), and/or other suboxides) from one or more surfaces of device 100a and/or device 300a using a wet etchant and/or a dry etchant process (e.g., a non-aqueous dilute HF etchant having trifluoroacetic acid ($CF_3CO_2H$), aqueous hydrogen fluoride (HF) of various concentration, a buffer etch containing ammonium fluoride ($NH_4F$), carbon tetrafluoride ($CF_4$), sulfur hexafluoride ($SF_6$), etc.). In this example, substrate 102 and/or superconducting component(s) 104 of device 100a and/or device 300a can constitute a qubit.

At 804, computer-implemented method 800 can comprise depositing a self assembled monolayer on the qubit. For example, with reference to FIGS. 1C, 2, and 3B, at 804, computer-implemented method 800 can comprise depositing one or more self assembled monolayers on one or more surfaces of device 100b and/or device 300a using a solution based self assembled monolayer deposition process (e.g., using solution 202) or a vapor phase based self assembled monolayer deposition process (e.g., using vapors 110). In this example, substrate 102 and/or superconducting component(s) 104 of device 100b and/or device 300a can constitute a qubit.

Figure 9:
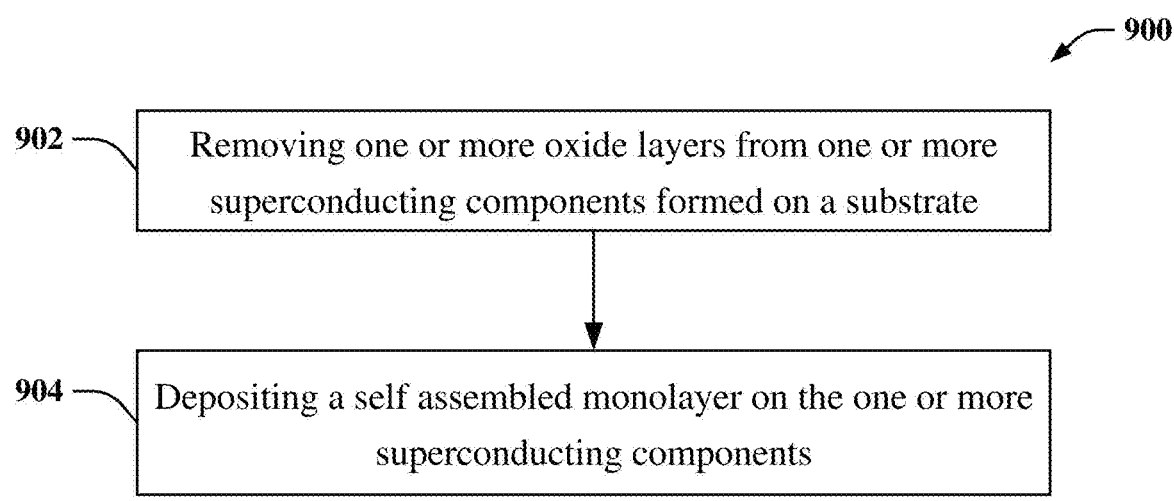
FIG. 9 illustrates a flow diagram of an example, non-limiting computer-implemented method that can facilitate formation of a self assembled monolayer on a quantum device in accordance with one or more embodiments described herein.

FIG. 9 illustrates a flow diagram of an example, non-limiting computer-implemented method 900 that can facilitate formation of a self assembled monolayer on a quantum device in accordance with one or more embodiments described herein. Repetitive description of like elements and/or processes employed in other embodiments described herein is omitted for sake of brevity.

At 902, computer-implemented method 900 can comprise removing one or more oxide layers from one or more superconducting components formed on a substrate. For example, with reference to FIGS. 1A, 1B, and 3A, at 902, computer-implemented method 900 can comprise removing first oxide layer 106 (e.g., silicon dioxide ($SiO_2$)) and/or second oxide layer 108 (e.g., niobium dioxide ($NbO_2$), niobium pentoxide ($Nb_2O_5$), and/or other suboxides) from one or more surfaces of superconducting component(s) 104 formed on substrate 102 of device 100a and/or device 300a using a wet etchant and/or a dry etchant process (e.g., a non-aqueous dilute HF etchant having trifluoroacetic acid ($CF_3CO_2H$), aqueous hydrogen fluoride (HF) of various concentration, a buffer etch containing ammonium fluoride ($NH_4F$), carbon tetrafluoride ($CF_4$), sulfur hexafluoride ($SF_6$), etc.).

At 904, computer-implemented method 900 can comprise depositing a self assembled monolayer on the one or more superconducting components. For example, with reference to FIGS. 1C, 2, and 3B, at 904, computer-implemented method 900 can comprise depositing one or more self assembled monolayers on one or more surfaces of superconducting component(s) 104 of device 100b and/or device 300a using a solution based self assembled monolayer deposition process (e.g., using solution 202) or a vapor phase based self assembled monolayer deposition process (e.g., using vapors 110).

Devices 100c, 200, and/or 300b can be associated with various technologies. For example, devices 100c, 200, and/or 300b can be associated with semiconductor and/or superconductor device technologies, semiconductor and/or superconductor device fabrication technologies, quantum computing device technologies, quantum computing device fabrication technologies, oxide removal technologies, self assembled monolayer deposition technologies, Josephson junction transmon device technologies, Josephson junction transmon device fabrication technologies, transmon qubit technologies, transmon qubit fabrication technologies, and/or other technologies.

Devices 100c, 200, and/or 300b can provide technical improvements to the various technologies listed above. For example, utilizing the oxide removal and self assembled monolayer deposition processes described above with reference to FIGS. 1A-5, 8, and/or 9, to fabricate devices 100c, 200, and/or 300b can stabilize and/or encapsulate (e.g., seal)

one or more components (e.g., substrate 102, superconducting component(s) 104, qubit, resonator, capacitor, etc.) of such device(s), thereby preventing re-oxidation of one or more surfaces of such component(s). In embodiments where devices 100c, 200, and/or 300b comprise quantum devices and/or where such component(s) comprise a qubit and/or other superconducting component(s) of a quantum device, by preventing re-oxidation of such surface(s) of such a qubit and/or other superconducting component(s), devices 100c, 200, and/or 300b can facilitate at least one of improved coherence time (e.g., longer coherence time), improved performance, and/or improved lifespan (e.g., longer lifespan) of such a qubit and/or other superconducting component(s).

Devices 100c, 200, and/or 300b can provide technical improvements to a processing unit associated with devices 100c, 200, and/or 300b. For example, based on the examples provided above describing fabrication of devices 100c, 200, and/or 300b using methods and/or materials that protect the elements of such devices from re-oxidation (e.g., substrate 102, superconducting component(s) 104, qubit, resonator, capacitor, etc.), devices 100c, 200, and/or 300b can facilitate improved (e.g., longer) coherence times, thereby facilitating improved processing performance of a quantum computing device (e.g., a quantum processor) comprising devices 100c, 200, and/or 300b.

A practical application of devices 100c, 200, and/or 300b is they can be implemented in a quantum computing device (e.g., a quantum computer) to improve processing performance of such a device, which can facilitate fast and/or possibly universal quantum computing. Such a practical application can improve the output (e.g., computation and/or processing results) of one or more compilation jobs (e.g., quantum computing jobs) that are executed on such a device(s).

It should be appreciated that devices 100c, 200, and/or 300b provide a new approach for fabricating superconducting devices which is driven by relatively new quantum computing technologies. For example, devices 100c, 200, and/or 300b provide a new approach for fabricating qubit devices (e.g., quantum processors, quantum computers, quantum circuits, quantum hardware, etc.) that can improve coherence time, performance, and/or lifespan of such a qubit device.

Devices 100c, 200, and/or 300b can be coupled to hardware and/or software to solve problems that are highly technical in nature, that are not abstract and that cannot be performed as a set of mental acts by a human. For example, devices 100c, 200, and/or 300b can be employed in a semiconductor and/or a superconductor device (e.g., integrated circuit) used to implement a quantum computing device that can process information and/or execute calculations that are not abstract and that cannot be performed as a set of mental acts by a human.

It should be appreciated that devices 100c, 200, and/or 300b can utilize various combinations of electrical components, mechanical components, and circuitry that cannot be replicated in the mind of a human or performed by a human. For example, facilitating an devices 100c, 200, and/or 300b in a semiconducting and superconducting device can enable operation of a quantum computing device (e.g., a quntum processor of a quantum computing device) is an operation that is greater than the capability of a human mind. For instance, the amount of data processed, the speed of processing such data, and/or the types of data processed over a certain period of time by such a quantum computing device utilizing devices 100c, 200, and/or 300b can be greater, faster, and/or different than the amount, speed, and/or data type that can be processed by a human mind over the same period of time.

According to several embodiments, devices 100c, 200, and/or 300b can also be fully operational towards performing one or more other functions (e.g., fully powered on, fully executed, etc.) while also performing the above-referenced operations. It should also be appreciated that such simultaneous multi-operational execution is beyond the capability of a human mind. It should also be appreciated that devices 100c, 200, and/or 300b can include information that is impossible to obtain manually by an entity, such as a human user. For example, the type, amount, and/or variety of information included in devices 100c, 200, and/or 300b can be more complex than information obtained manually by a human user.

The example, non-limiting multi-step fabrication sequences described above with reference to FIGS. 1A-5, 8, and/or 9, which can be implemented to fabricate one or more embodiments of the subject disclosure described herein and/or illustrated in the figures, can be implemented by a computing system (e.g., operating environment 1000 illustrated in FIG. 10 and described below) and/or a computing device (e.g., computer 1012 illustrated in FIG. 10 and described below). In non-limiting example embodiments, such computing system (e.g., operating environment 1000) and/or such computing device (e.g., computer 1012) can comprise one or more processors and one or more memory devices that can store executable instructions thereon that, when executed by the one or more processors, can facilitate performance of the example, non-limiting multi-step fabrication operations described herein with reference to FIGS. 1A-5, 8, and/or 9. As a non-limiting example, the one or more processors can facilitate performance of the example, non-limiting multi-step fabrication operations described herein with reference to FIGS. 1A-5, 8, and/or 9 by directing and/or controlling one or more systems and/or equipment operable to perform semiconductor and/or superconductor device fabrication.

For simplicity of explanation, the methodologies described herein (e.g., computer-implemented methodologies) are depicted and described as a series of acts. It is to be understood and appreciated that the subject innovation is not limited by the acts illustrated and/or by the order of acts, for example acts can occur in various orders and/or concurrently, and with other acts not presented and described herein. Furthermore, not all illustrated acts can be required to implement the methodologies described herein (e.g., computer-implemented methodologies) in accordance with the disclosed subject matter. In addition, those skilled in the art will understand and appreciate that such methodologies could alternatively be represented as a series of interrelated states via a state diagram or events. Additionally, it should be further appreciated that the methodologies (e.g., computer-implemented methodologies) disclosed hereinafter and throughout this specification are capable of being stored on an article of manufacture to facilitate transporting and transferring such methodologies (e.g., computer-implemented methodologies) to computers. The term article of manufacture, as used herein, is intended to encompass a computer program accessible from any computer-readable device or storage media.

Figure 10:
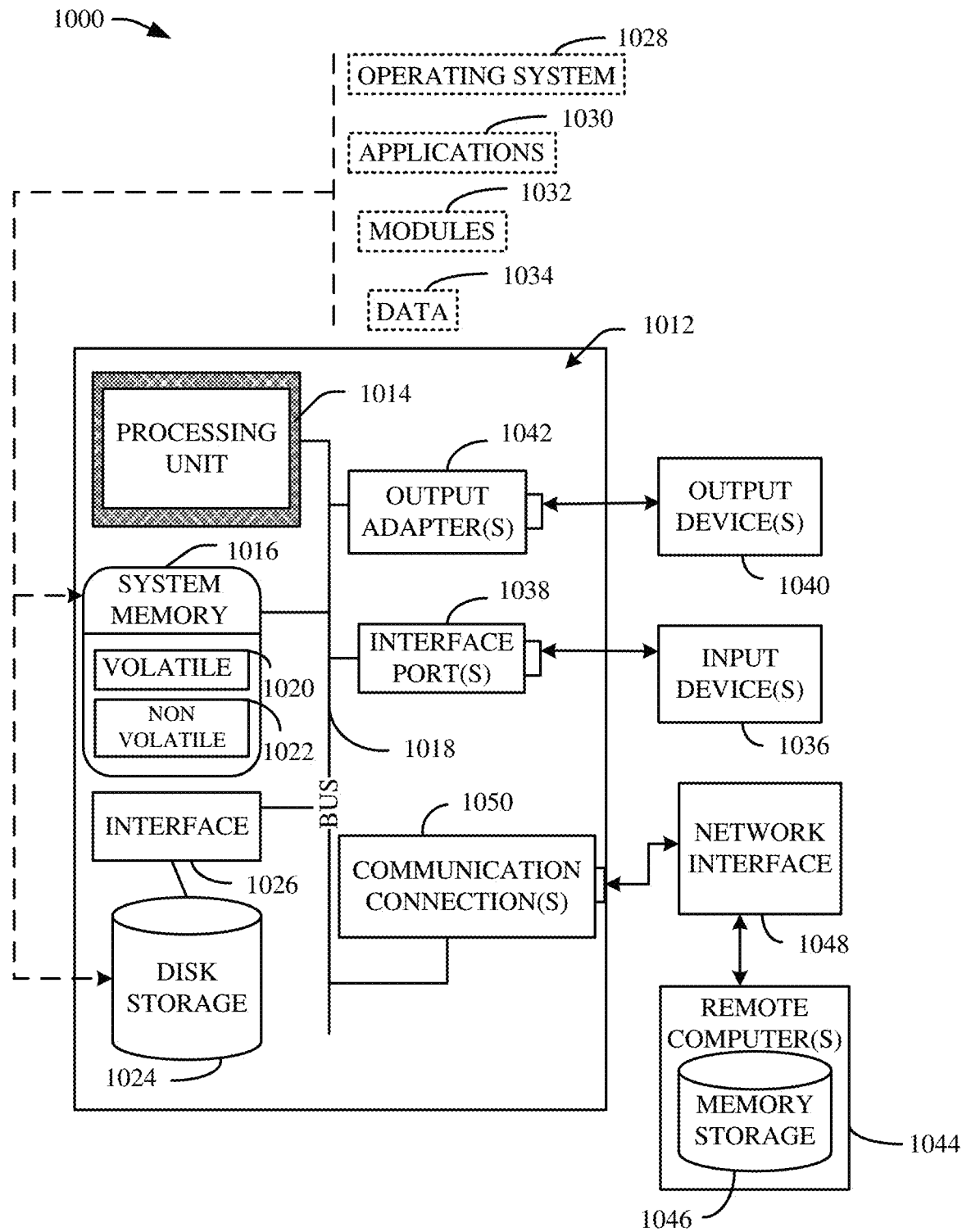
FIG. 10 illustrates a block diagram of an example, non-limiting operating environment in which one or more embodiments described herein can be facilitated.

In order to provide a context for the various aspects of the disclosed subject matter, FIG. 10 as well as the following discussion are intended to provide a general description of a suitable environment in which the various aspects of the disclosed subject matter can be implemented. FIG. 10 illustrates a block diagram of an example, non-limiting operating environment in which one or more embodiments described herein can be facilitated. For example, operating environment 1000 can be used to implement the example, non-limiting multi-step fabrication operations described herein with reference to FIGS. 1A-5, 8, and/or 9 which can facilitate implementation of one or more embodiments of the subject disclosure described herein. Repetitive description of like elements and/or processes employed in other embodiments described herein is omitted for sake of brevity.

With reference to FIG. 10, a suitable operating environment 1000 for implementing various aspects of this disclosure can also include a computer 1012. The computer 1012 can also include a processing unit 1014, a system memory 1016, and a system bus 1018. The system bus 1018 couples system components including, but not limited to, the system memory 1016 to the processing unit 1014. The processing unit 1014 can be any of various available processors. Dual microprocessors and other multiprocessor architectures also can be employed as the processing unit 1014. The system bus 1018 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire (IEEE 1394), and Small Computer Systems Interface (SCSI).

The system memory 1016 can also include volatile memory 1020 and nonvolatile memory 1022. The basic input/output system (BIOS), containing the basic routines to transfer information between elements within the computer 1012, such as during start-up, is stored in nonvolatile memory 1022. Computer 1012 can also include removable/non-removable, volatile/non-volatile computer storage media. FIG. 10 illustrates, for example, a disk storage 1024. Disk storage 1024 can also include, but is not limited to, devices like a magnetic disk drive, floppy disk drive, tape drive, Jaz drive, Zip drive, LS-100 drive, flash memory card, or memory stick. The disk storage 1024 also can include storage media separately or in combination with other storage media. To facilitate connection of the disk storage 1024 to the system bus 1018, a removable or non-removable interface is typically used, such as interface 1026. FIG. 10 also depicts software that acts as an intermediary between users and the basic computer resources described in the suitable operating environment 1000. Such software can also include, for example, an operating system 1028. Operating system 1028, which can be stored on disk storage 1024, acts to control and allocate resources of the computer 1012.

System applications 1030 take advantage of the management of resources by operating system 1028 through program modules 1032 and program data 1034, e.g., stored either in system memory 1016 or on disk storage 1024. It is to be appreciated that this disclosure can be implemented with various operating systems or combinations of operating systems. A user enters commands or information into the computer 1012 through input device(s) 1036. Input devices 1036 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1014 through the system bus 1018 via interface port(s) 1038. Interface port(s) 1038 include, for example, a serial port, a parallel port, a game port, and a universal serial bus (USB). Output device(s) 1040 use some of the same type of ports as input device(s) 1036. Thus, for example, a USB port can be used to provide input to computer 1012, and to output information from computer 1012 to an output device 1040. Output adapter 1042 is provided to illustrate that there are some output devices 1040 like monitors, speakers, and printers, among other output devices 1040, which require special adapters. The output adapters 1042 include, by way of illustration and not limitation, video and sound cards that provide a means of connection between the output device 1040 and the system bus 1018. It should be noted that other devices and/or systems of devices provide both input and output capabilities such as remote computer(s) 1044.

Computer 1012 can operate in a networked environment using logical connections to one or more remote computers, such as remote computer(s) 1044. The remote computer(s) 1044 can be a computer, a server, a router, a network PC, a workstation, a microprocessor based appliance, a peer device or other common network node and the like, and typically can also include many or all of the elements described relative to computer 1012. For purposes of brevity, only a memory storage device 1046 is illustrated with remote computer(s) 1044. Remote computer(s) 1044 is logically connected to computer 1012 through a network interface 1048 and then physically connected via communication connection 1050. Network interface 1048 encompasses wire and/or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). Communication connection(s) 1050 refers to the hardware/software employed to connect the network interface 1048 to the system bus 1018. While communication connection 1050 is shown for illustrative clarity inside computer 1012, it can also be external to computer 1012. The hardware/software for connection to the network interface 1048 can also include, for exemplary purposes only, internal and external technologies such as, modems including regular telephone grade modems, cable modems and DSL modems, ISDN adapters, and Ethernet cards.

The present invention may be a system, a method, an apparatus and/or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can or can be implemented in combination with other program modules. Generally, program modules include routines, programs, components, data structures, etc. that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments in which tasks are performed by remote processing devices that are linked through a communications network. However, some, if not all aspects of this disclosure can be practiced on stand-alone computers. In a distributed computing environment, program modules can be located in both local and remote memory storage devices. For example, in one or more embodiments, computer executable components can be executed from memory that can include or be comprised of one or more distributed memory units. As used herein, the term "memory" and "memory unit" are interchangeable. Further, one or more embodiments described herein can execute code of the computer executable components in a distributed manner, e.g., multiple processors combining or working cooperatively to execute code from one or more distributed memory units. As used herein, the term "memory" can encompass a single memory or memory unit at one location or multiple memories or memory units at one or more locations.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or non-volatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

The descriptions of the various embodiments have been presented for purposes of illustration, but are not intended to be exhaustive or limited to the embodiments disclosed.

Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method, comprising:
   removing one or more oxide layers from at least one surface of a quantum device being formed on a substrate, wherein the quantum device comprises a niobium based material at the at least one surface of the quantum device, and the quantum device comprises a qubit; and
   depositing an organic component comprising a thiol on the at least one surface of the quantum device, wherein the thiol of the organic component interacts with the niobium based material at the at least one surface of the quantum device to cause the organic component to form a self assembled monolayer on the at the at least one surface of the quantum device.

2. The method of claim 1, further comprising:
   removing one or more second oxide layers from a surface of the substrate; and
   depositing the organic component on the surface of the substrate.

3. The method of claim 2, wherein the removing the one or more second oxide layers comprises employing a dilute etchant that hydrogen-terminates the surface of the substrate.

4. The method of claim 1, wherein the depositing the organic component on the at least one surface of the quantum device comprises using at least one of a solution based deposition process or a vapor phase based deposition process.

5. The method of claim 1, wherein the self assembled monolayer on the at least one surface of the quantum device prevents oxidation of on the at least one surface of the quantum device, thereby facilitating at least one of improved coherence time of the qubit or improved lifespan of the qubit.

6. A method, comprising:
   removing one or more oxide layers from at least one surface of a component of a quantum device being formed on a substrate, wherein the component comprises a niobium based material at the at least one surface of the component; and
   depositing an organic component comprising a thiol on the at least one surface of the component, wherein the thiol of the organic component interacts with the niobium based material at the at least one surface of the component to cause the organic component to form a self assembled monolayer on the at the at least one surface of the component.

7. The method of claim 6, further comprising:
   removing one or more second oxide layers from a surface of the substrate; and
   depositing the organic component on the surface of the substrate.

8. The method of claim 7, wherein the removing the one or more second oxide layers comprises employing a dilute etchant that hydrogen-terminates the surface of the substrate.

9. The method of claim 6, wherein the self assembled monolayer on the at least one surface of the component prevents oxidation of the at least one surface of the component, thereby facilitating at least one of improved coherence time of the component or improved lifespan of the component.

10. The method of claim 6, wherein the depositing the organic component on the at least one surface of the component comprises using at least one of a solution based deposition process or a vapor phase based deposition process.

* * * * *